United States Patent
Huang et al.

(10) Patent No.: US 11,848,396 B2
(45) Date of Patent: Dec. 19, 2023

(54) SURFACTANT ADDITIVE FOR SOLUTION COATING LARGE AREA HIGH EFFICIENCY PEROVSKITE SOLAR CELLS AND OTHER DEVICES

(71) Applicant: NUtech Ventures, Lincoln, NE (US)

(72) Inventors: Jinsong Huang, Lincoln, NE (US); Yehao Deng, Chapel Hill, NC (US)

(73) Assignee: NUTech Ventures, Inc., Lincoln, NE (US)

( * ) Notice: Subject to any disclaimer, the term of this patent is extended or adjusted under 35 U.S.C. 154(b) by 0 days.

(21) Appl. No.: 16/125,400

(22) Filed: Sep. 7, 2018

(65) Prior Publication Data

US 2020/0028022 A1 Jan. 23, 2020

Related U.S. Application Data

(60) Provisional application No. 62/555,534, filed on Sep. 7, 2017.

(51) Int. Cl.

| | | |
|---|---|---|
| *H01L 31/08* | (2006.01) | |
| *H01L 31/0216* | (2014.01) | |
| *H10K 30/00* | (2023.01) | |
| *H01L 31/032* | (2006.01) | |
| *H01L 31/18* | (2006.01) | |

(52) U.S. Cl.
CPC ........ *H01L 31/18* (2013.01); *H01L 31/02167* (2013.01); *H01L 31/032* (2013.01); *H10K 30/00* (2023.02)

(58) Field of Classification Search
CPC . H01L 31/18; H01L 31/02167; H01L 31/032; H01L 51/42; H10K 30/00
See application file for complete search history.

(56) References Cited

U.S. PATENT DOCUMENTS

| | | | |
|---|---|---|---|
| 2003/0013008 A1* | 1/2003 | Ono | H01L 27/14621 |
| | | | 429/111 |
| 2006/0233697 A1* | 10/2006 | Zhou | B82Y 30/00 |
| | | | 423/610 |
| 2011/0048772 A1* | 3/2011 | Han | C09D 11/52 |
| | | | 174/257 |

(Continued)

FOREIGN PATENT DOCUMENTS

| | | | | |
|---|---|---|---|---|
| KR | 20160055093 A | * | 5/2016 | C09K 11/06 |

OTHER PUBLICATIONS

Ding, Yanli et al., "Surfactant enhanced surface coverage of CH3NH3PbI3—xClx perovskite for highly efficient mesoscopic solar cells ", Journal of Power Sources 272 (2014) 351-355. (Year: 2014).*

(Continued)

*Primary Examiner* — Tamir Ayad
(74) *Attorney, Agent, or Firm* — Gerald T. Gray; Leydig, Voit & Mayer, LTD.

(57) ABSTRACT

In an aspect, a method of forming a photoactive device comprises: providing a perovskite-surfactant solution, said perovskite-surfactant solution comprising a perovskite ink and a surfactant; and coating said perovskite-surfactant solution onto a receiving surface of a substrate thereby forming a layer of said photoactive device; wherein said layer comprises a perovskite material; and wherein an active area of said photoactive device is at least 1 cm$^2$.

Figure 1:
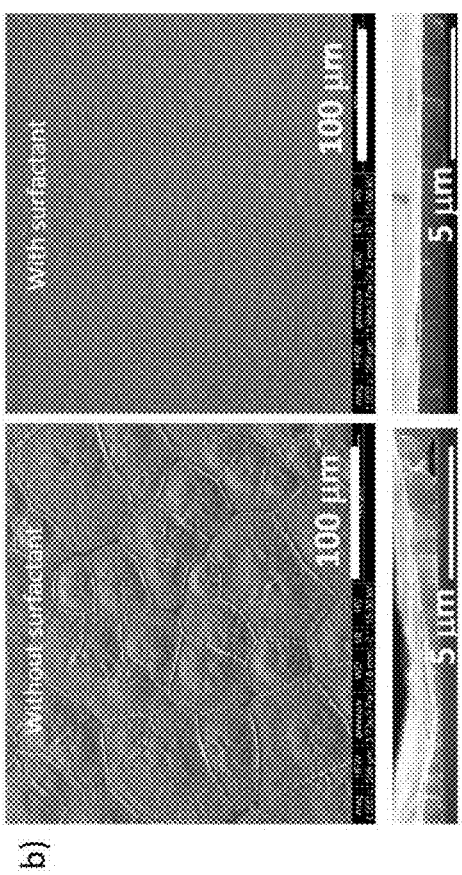
Figure 1:
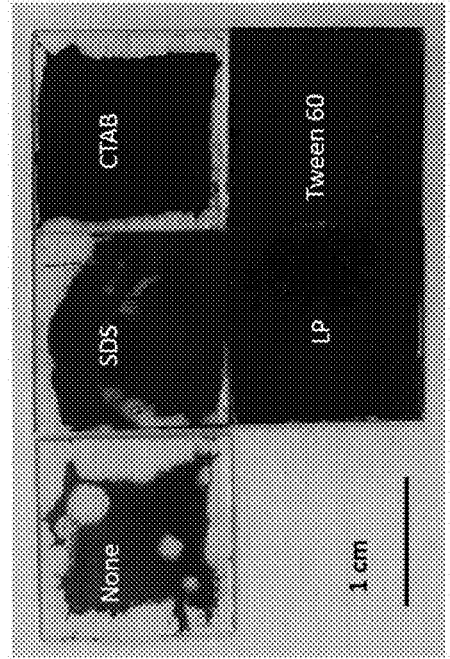

22 Claims, 20 Drawing Sheets a b

(56) References Cited

U.S. PATENT DOCUMENTS

| | | | | |
|---|---|---|---|---|
| 2016/0218307 | A1* | 7/2016 | Huang | H01L 51/0028 |
| 2017/0009062 | A1* | 1/2017 | Kimura | C08K 9/06 |
| 2017/0087633 | A1* | 3/2017 | Murano | B22F 1/0022 |
| 2017/0346031 | A1* | 11/2017 | Lee | C09D 127/18 |
| 2018/0105543 | A1* | 4/2018 | Zhu | C07F 7/24 |

OTHER PUBLICATIONS

Remeika, Mikas et al., "Transferrable optimization of spray-coated PbI2 films for perovskite solar cell fabrication", Journal of Materials Chemistry A, vol. 5, No. 12, pp. 5709-5718. (Year: 2017).*

Bishop, James E. et al., "Spray-cast multilayer perovskite solar cells with an active-area of 1.5 cm2", Scientific Reports, 7:7962, pp. 1-11. (Year: 2017).*

Chang, Wei-Chieh, "Controlled Deposition and Performance Optimization of Perovskite Solar Cells Using Ultrasonic Spray-Coating of Photoactive Layers", ChemSusChem, 10, pp. 1405-1412. (Year: 2017).*

Lee, Jinho et al., "Achieving Large-Area Planar Perovskite Solar Cells by Introducing an Interfacial Compatibilizer", Adv. Mater. 29, 1606363 (8 pages). (Year: 2017).*

Tait, J. G. et al., "Rapid composition screening for perovskite photovoltaics via concurrently pumped ultrasonic spray coating", J. Mater. Chem. A, 4, pp. 3792-3797. (Year: 2016).*

Wang, Qi et al., "Doped hole transport layer for efficiency enhancement in planar heterojunction organolead trihalide perovskite solar cells", Nano Energy, 15, pp. 275-280. (Year: 2015).*

Yang, Zhibin et al., "High-Performance Fully Printable Perovskite Solar Cells via Blade-Coating Technique under the Ambient Condition", Adv. Energy Mater. 2015, 5, 1500328, pp. 1-6. (Year: 2015).*

Manshor, Nurul Ain, et al., "Humidity versus photo-stability of metal halide perovskite films in a polymer matrix", Phys. Chem. Chem . Phys., 2016, 18, 21629-21639. (Year: 2016).*

Ding et al. (2014) "Surfactant enhanced surface coverage of $CH_3NH_3PbI_{3-x}Cl_x$ perovskite for highly efficient mesoscopic solar cells," Journal of Power Sources 272: 351-355.

Friedli et al. (2001) "Detergency of Specialty Surfactants," Surfactant Science Series, vol. 98; Marcel Dekker, Inc., 294 pp.

Guo et al. (2016) "Polymer Stabilization of Lead(II) Perovskite Cubic Nanocrystals for Semitransparent Solar Cells," Adv. Energy Mater. 6: 1502317, 9 pp.

Li et al. (2018) "Scalable fabrication of perovskite solar cells," Nat. Rev. Mater. 3: 18017, 20 pp.

Xiong et al. (2018) "Modifying Perovskite Films with Polyvinylpyrrolidone for Ambient-Air-Stable Highly Bendable Solar Cells," ACS Appl. Mater. Interfaces 10: 35385-35394.

Zuo et al. (2017) "Polymer-modified halide perovskite films for efficient and stable planar heterojunction solar cells," Sci. Adv. 3: e1700106, 12 pp.

* cited by examiner

L-α-Phosphatidylcholine
(amphoteric)

Didodecyldimethylammonium bromide
(cationic)

Polyethylene glycol sorbitan
monostearate (non-ionic)

Sodium dodecyl sulfate
(anionic)

Tween 60: Polyethylene glycol sorbitan monostearate;
SDS: Sodium dodecyl sulfate;
DDAB: Didodecyldimethylammonium bromide;
LP: L-α-Phosphatidylcholine.

|  | $J_{SC}$ (mA) | $V_{OC}$ (V) | FF (%) | PCE (%) |
| --- | --- | --- | --- | --- |
| Tween 60 | 21.5 | 1.10 | 78.2 | 18.4 |
| DDAB | 21.7 | 1.10 | 75.0 | 17.9 |

Current-voltage scan direction: $J_{sc}$ to $V_{oc}$(blue); $V_{oc}$ to $J_{sc}$(red)
Scan conditions: Rate: 0.84 V/s
Environmental conditions: Temperature: 25 °C; Relative humidity: 30 %
Solar simulator: Type: Xenon ; Light intensity: 100 mW/cm$^2$
Reference cell: silicon (calibrated)
Number of modules: 2
Module dimension: 13.0 x 8.5 cm$^2$
Aperture area: 58.3 cm$^2$ (module 1); 57.8 cm$^2$ (module 2)

SURFACTANT ADDITIVE FOR SOLUTION COATING LARGE AREA HIGH EFFICIENCY PEROVSKITE SOLAR CELLS AND OTHER DEVICES

CROSS-REFERENCE TO RELATED APPLICATIONS

This application claims the benefit of priority to U.S. Provisional Patent Application No. 62/555,534, filed Sep. 7, 2017, which is hereby incorporated by reference in its entirety.

FEDERALLY SPONSORED RESEARCH OR DEVELOPMENT

This invention was made with Government support under contract N00014-15-1-2713 awarded by the Office of Naval Research. The government has certain rights in the invention.

BACKGROUND

The present disclosure generally provides perovskite based photactive electronic devices, and more particularly systems and methods for forming perovskite based photactive electronic devices.

Perovskite solar cells (PSC) have experienced an efficiency boost from 3% to over 22% since 2009. However, most milestones were achieved by spin-coating, which method is not compatible with scalable fabrication such as roll-to-roll processes. Scalable perovskite solar cell fabrication methods have been of recent interest, among which blade coating draws much attention due to its simplicity, versatility and high compatibility with more sophisticated roll-to-roll processes such as slot-die coating and gravure coating. Blade coated perovskite solar cells were first reported in 2015 by several groups independently with a highest efficiency of over 15% (see, e.g., Deng Y, Peng E, Shao Y, et al. Scalable fabrication of efficient organolead trihalide perovskite solar cells with doctor-bladed active layers. Energy & Environmental Science, 2015, 8(5): 1544-1550; Kim J H, Williams S T, Cho N, et al. Enhanced Environmental Stability of Planar Heterojunction Perovskite Solar Cells Based on Blade-Coating. Advanced Energy Materials, 2015, 5(4); and Razza S, Di Giacomo F, Matteocci F, et al. Perovskite solar cells and large area modules (100 cm$^2$) based on an air flow-assisted PbI$^2$ blade coating deposition process. Journal of Power Sources, 2015, 277: 286-291.) Through perovskite composition or solvent engineering, the efficiency has been improved to over 18% and is anticipated to catch up to the spin-coating devices (see, e.g., Deng Y, Dong Q, Bi C, et al. Air-Stable, Efficient Mixed-Cation Perovskite Solar Cells with Cu Electrode by Scalable Fabrication of Active Layer. Advanced Energy Materials, 2016, 6(11); and Yang M, Li Z, Reese M O, et al. Perovskite ink with wide processing window for scalable high-efficiency solar cells. Nature Energy, 2017, 2 (NREL/JA-5900-67357).).

A compact and uniform perovskite grain structure is important for high device performance. However, during the drying process, there is strong convection inside the blade coated perovskite solution film driven by substrate heating and surface evaporation. It has been found that the convection causes uneven cell-like domain structure on the perovskite film that prevents coating of a uniform perovskite film for efficient charge collection (see, e.g., Deng Y, Dong Q, Bi C, et al. Air-Stable, Efficient Mixed-Cation Perovskite Solar Cells with Cu Electrode by Scalable Fabrication of Active Layer. Advanced Energy Materials, 2016, 6(11)).). Random pin-holes may present at domain boundaries which reduce the large area device efficiency. In addition, the solvents of perovskite (e.g., DMF, DMSO, and GBL) generally have high surface tension and low vapor pressure, as is shown in Table 1. The surface tension is further increased when perovskite solute is dissolved, which leads to increased ionic strength of the solution. When coating on a substrate that is not sufficiently hydrophilic, the perovskite solution would shrink during drying and leave uncoated regions as the "lotus effect", preventing full coverage large area coating.

Accordingly, there is a need for improved perovskite device fabrication methods, particularly for large-scale, roll-to-roll processes.

BRIEF SUMMARY

The present disclosure provides methods for forming photoactive devices or a layer thereof, wherein the device, or layer thereof, has a perovskite material. The methods include providing a surfactant in addition to a perovskite ink. The addition of small amounts of surfactant provides for higher quality films and faster coating speeds. The methods disclosed herein are compatible with, and enhance films formed by, continuous-type coating methods, such as blade coating. The methods disclosed herein provide for photoactive devices that have a large active (e.g., greater than or equal to 30 cm$^2$) area and are highly efficient (e.g., photovoltaic cells characterized by 15% or greater photovoltaic efficiency). Photovoltaic cells which include a small amount of surfactant in the perovskite material layer, are also disclosed herein.

In an aspect, a method of forming a photoactive device comprises: providing a perovskite-surfactant solution, the perovskite-surfactant solution comprising a perovskite ink and a surfactant; and coating the perovskite-surfactant solution onto a receiving surface of a substrate thereby forming a layer of the photoactive device; wherein the layer comprises a perovskite material; and wherein an active area of the photoactive device is greater than 0.1 cm$^2$, preferably greater than 0.2 cm$^2$, preferably greater than 0.5 cm$^2$, preferably greater than 1 cm$^2$, more preferably greater than or equal to 1.95 cm$^2$, preferably greater than 10 cm$^2$, preferably greater than 20 cm$^2$, preferably greater than 30 cm$^2$, preferably greater than 33 cm$^2$, more preferably greater than 50 cm$^2$, and more preferably greater than 57 cm$^2$. In an aspect, a method of forming a photoactive device comprises: providing a perovskite-surfactant solution, the perovskite-surfactant solution comprising a perovskite ink and a surfactant; and coating the perovskite-surfactant solution onto a receiving surface of a substrate thereby forming a layer of the photoactive device; wherein the layer comprises a perovskite material; and wherein an active area of the photoactive device is at least 1 cm$^2$. In some embodiments, the step of coating is performed via a continuous-type coating process. In some embodiments, the continuous-type coating process is selected from the group consisting of blade coating, die coating, slot die coating, slide die coating, gravure coating, shear coating, spray coating, inkjet printing, curtain coating, bead coating, screen printing, flexographic printing, and any combination thereof. In some embodiments, the coating is performed at a coating speed of at least 10 mm/s. In some embodiments, the coating is performed at a coating speed of at least 20 mm/s, and optionally a coating speed of at least 50 mm/s. In some embodiments, the coating speed is such that the formation of the layer is characterized by Landau-Levich flow (which may also be referred to as the Landau-Levich regime).

In some embodiments, an interquartile range (IQR) of a photovoltaic efficiency of at least 8 photovoltaic cells is less than or equal to 2 percentage points of photovoltaic efficiency; wherein the at least 8 photovoltaic cells are positioned on a common substrate and the at least 8 photovoltaic cells are exposed to equivalent incident light flux and equivalent spectrum. As used herein, a percentage point is a unit of one percent or, in other words, a unit of the arithmetic difference of two percentage such as an efficiency of 15% and an efficiency of 10% differ by 5 percentage points. In some embodiments, an IQR of a fill factor of at least 8 photovoltaic cells is less than or equal to 5 percentage points; wherein the at least 8 photovoltaic cells are positioned on a common substrate and the at least 8 photovoltaic cells are exposed to equivalent incident light flux and equivalent spectrum. In some embodiments, an IQR of an open circuit voltage of at least 8 photovoltaic cells is less than or equal to 0.1 V; wherein the at least 8 photovoltaic cells are positioned on a common substrate and the at least 8 photovoltaic cells are exposed to equivalent incident light flux and equivalent spectrum. In some embodiments, an IQR of a short circuit current density of at least 8 photovoltaic cells is less than or equal to 2 mA/cm$^2$; wherein the at least 8 photovoltaic cells are positioned on a common substrate and the at least 8 photovoltaic cells are exposed to equivalent incident light flux and equivalent spectrum. The terms fill factor, open circuit voltage, photovoltaic efficiency, short circuit current density, and IQR will be understood by one of ordinary skill.

In some embodiments, a concentration of the surfactant in the perovskite-surfactant solution is selected from the range of 0.001 mM to 1 M. In some embodiments, a concentration of the surfactant in the perovskite-surfactant solution is selected from the range of 0.01 mM to 1 M. In some embodiments, a concentration of the surfactant in the perovskite-surfactant solution is selected from the range of 0.01 mM to 100 mM. The concentration of the surfactant in the perovskite-surfactant solution may be selected from the range of 0.01 mM to 1 mM. The concentration of the surfactant in the perovskite-surfactant solution may be selected from the range of 0.1 mM to 1 mM. In some embodiments, the concentration of the surfactant in the perovskite-surfactant solution is within 20% of 0.25 mM. In some embodiments, the method further comprises combining the surfactant and the perovskite ink to form the perovskite-surfactant solution.

In some embodiments, the substrate is heated to a temperature of at least 50° C. during the step of coating. In some embodiments, the substrate is heated to a temperature of at least 100° C. during the step of coating. In some embodiments, the substrate is heated to a temperature less than or equal to 200° C. during the step of coating. The substrate may be heated to a temperature selected from the range of 100 to 200° C. during the step of coating. The substrate may be heated to a temperature selected from the range of 100 to 150° C. during the step of coating.

In some embodiments, the perovskite material comprises at least one of methylammonium lead halide, formamidinium lead halide, cesium lead halide, methylammonium tin halide, formamidinium tin halide, cesium tin halide, and any combination of these. In some embodiments, the perovskite material comprises at least one of methylammonium lead halide, formamidinium lead halide, cesium lead halide, methylammonium tin halide, formamidinium tin halide, cesium tin halide, methylammonium halide, formamidinium halide, cesium halide, lead halide, tin halide, and any combination of these. The term "halide" refers to a halogen atom, such as iodine, bromine, and chlorine. The compounds methylammonium lead halide, formamidinium lead halide, cesium lead halide, methylammonium tin halide, formamidinium tin halide, and cesium tin halide include all chemically, thermodynamically, and stoichiometrically appropriate variants of these compounds. For example, methylammonium lead halide may refer to methylammonium lead tri-halide ($CH_3NH_3PbX_3$, where X is halide), such as methylammonium lead tri-iodide ($CH_3NH_3PbI_3$).

In some embodiments, the perovskite ink comprises a perovskite material dissolved in a solvent. The solvent comprises at least one solvent capable of dissolving the perovskite material. In some embodiments, the solvent comprises at least one of Dimethylformamide (DMF), Formamide, Dimethylacetamide (DMAc), N-Methylformamide, N-Methyl-2-pyrrolidone (NMP), N-Vinylacetamide, N-Vinylpyrrolidone, Dimethyl sulfoxide (DMSO), gamma-Butyrolactone (GBL), and 2-Methoxyethanol. In some embodiments, the solvent comprises at least one of water, methanol, 1-propanol (PrOH), isopropyl alcohol, 1-Pentanol, hydrogen iodide aqueous solution, dimethylethanolamine, acetic acid, xylene, ethylene glycol, diethyl ether, acetonitrile, Sulfolane, Dimethylformamide (DMF), Diethylformamide, methyl phenyl sulfoxide, diphenyl sulfoxide, diethyl sulfite, methylsulfonylmethane, tetramethylene sulfane, ethylene sulfite, nitrous acid, nitromethane, thiosulfuric acid, dimethyl sulfate, hydrophosphorous acid, sulfuric acid, phosphoric acid, Formamide, Dimethylacetamide (DMAc), N-Methylformamide, N-Methyl-2-pyrrolidone (NMP), 1,3-Dimethyl-2-imidazolidinone, N-Vinylacetamide, N,N'-Dimethylpropyleneurea (DMPU), 2-dimethylaminoethanol, Ethyl lactate, N-Vinylpyrrolidone, Dimethyl sulfoxide (DMSO), diethyl sulfoxide, tetrahydrothiophene oxide, N-Formylmorpholine, N-Methylformamide, 2-Pyrrolidone, Tetramethylurea, N-Vinylacetamide, N-Vinylpyrrolidone, Dimethyl sulfite, Diethyl sulfite, Methyl methanesulfonate, Dimethyl sulfate, 1,3-Dimethyl-2-imidazolidinone, gamma-Butyrolactone (GBL), Dioxane, Dioxolane, Propylene carbonate (PC), 1,2-dimethoxyethane, methyl ethyl ketone, 2-methylpyrazine, 2-Methoxyethanol, 2-Methoxyethanol acetate, 2-Ethoxyethanol, 2-Ethoxyethanol acetate, 1-Methoxy-2-propanol, 1-methoxy-2-propanol acetate, 2-Butoxyethanol, 2-Butoxyethanol acetate, 2-Propyloxyethanol, 2-Propyloxyethanol acetate, Ethyl 3-ethoxypropionate, ethylene glycol monopropyl ether, amine, and methylamine.

In some embodiments, the surfactant comprises at least one of polyethylene glycol sorbitan monostearate (Tween 60), L-α-Phosphatidylcholine (LP), Sodium dodecyl sulfate (SDS), cetyltrimethylammonium bromide (CTAB), and didodecyldimethylammonium bromide (DDAB). In some embodiments, the surfactant is selected from the group consisting of an anionic surfactant, a cationic surfactant, a nonionic surfactants, a zwitterionic (amphoteric) surfactant, and any combination thereof.

In some embodiments, a thickness of the layer is selected from the range of 0.1 to 2 μm, optionally 0.3 to 1.5 μm, optionally 0.3 to 1 μm. In some embodiments, a thickness of the layer is characterized by a thickness variation of less than 100 nm, preferably less 50 nm, and preferably less than 20 nm, over a length scale of at least 0.1 mm, preferably at least 1 mm, preferably at least 5 mm, and preferably at least 9 mm. In some embodiments, a thickness of the layer is selected from the range of 0.3 to 1.5 μm and the layer is characterized by a thickness variation of less than 50 nm over a length scale of at least 9 mm. In some embodiments, a surface roughness of the layer is characterized by a root-mean-square value of less than or equal to 14.5 nm over a 1 cm length scale. In some embodiments, a surface roughness of the layer is characterized by a root-mean-square value of less than or equal to 20 nm over a 1 cm length scale. In some embodiments, the receiving surface of the substrate is hydrophobic. In some embodiments, the receiving surface comprises a metal, metal oxide, small molecule, polymer, carbon-based or ceramic material. In some embodiments, the receiving surface comprises a glass material coated with one or more surfactants.

In some embodiments, the active area the photoactive device (e.g., photovoltaic cell) is at least 15 cm$^2$. In some embodiments, the active area of the photoactive device (e.g., photovoltaic cell) is at least 1.9 cm$^2$, preferably at least 5 cm$^2$, preferably at least 10 cm$^2$, preferably at least 15 cm$^2$, preferably at least 30 cm$^2$, or more preferably at least 50 cm$^2$. In some embodiments, the photoactive device is a photovoltaic cell. In some embodiments, the photovoltaic cell is characterized by a photovoltaic efficiency of at least 15%, or more preferably at least 20%. In some embodiments, the photovoltaic cell is characterized by a photovoltaic efficiency of at least 15% and an active area of at least 1.9 cm$^2$. In some embodiments, the photovoltaic cell is characterized by a photovoltaic efficiency of at least 15% and an active area of at least 30 cm$^2$. In some embodiments, the photovoltaic cell is characterized by a photovoltaic efficiency selected from the range of 14.6% to 15.3% and an active area selected from the range of 1.9 to 3.6 cm$^2$. In some embodiments, the photovoltaic cell is characterized by a photovoltaic efficiency selected from the range of 14.6% to 15.3% and an active area selected from the range of 33 to 58 cm$^2$.

In an aspect, a method of forming a photoactive device comprises: providing a perovskite-surfactant solution, the perovskite-surfactant solution comprising a perovskite ink and a surfactant; and coating the perovskite-surfactant solution onto a receiving surface of a substrate thereby forming a layer of the photoactive device; wherein the layer comprises a perovskite material; wherein the step of coating is performed via a continuous-type coating process; and wherein the coating is performed at a coating speed of at least 10 mm/s. In some embodiments, an active area of the photoactive device is at least 1 cm$^2$. In some embodiments, the active area is at least 15 cm$^2$. In some embodiments, photoactive device is a photovoltaic cell. In some embodiments, the photovoltaic cell is characterized by a photovoltaic efficiency of at least 15% and an active area of at least 30 cm$^2$.

In an aspect, a photovoltaic cell comprises: a substrate; and a photoactive layer above the substrate; wherein the photoactive layer comprises a perovskite material and a surfactant; and wherein an active area of the photovoltaic cell is at least 1 cm$^2$. In some embodiments, a molar ratio of the surfactant to the perovskite material in the layer is selected from the range of 1.25e-5 to 0.125. (A value of "XeY" refers to the value of X×10$^Y$.) A molar ratio of the surfactant to the perovskite material in the layer may be substantially 3.125e-4. In some embodiments, In some embodiments, the active area is at least 15 cm$^2$. In some embodiments, the photovoltaic cell is characterized by a photovoltaic efficiency of at least 15% and an active area of at least 30 cm$^2$. In some embodiments, the photovoltaic cell is characterized by a photovoltaic efficiency selected from the range of 14.6% to 15.3% and an active area selected from the range of 33.0 to 57.2 cm$^2$.

Disclosed herein are photoactive devices having any combination of the embodiments of photoactive devices (e.g., photovoltaic cells) described herein. Disclosed herein are methods comprising any combination of embodiments of the methods and/or of the photoactive devices described herein. Also disclosed herein are processes for forming any of the photoactive devices disclosed herein.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE SEVERAL VIEWS OF THE DRAWING(S)

The detailed description is described with reference to the accompanying FIGs. The use of the same reference numbers in different instances in the description and the FIGs. may indicate similar or identical items.

FIG. 1. Panel (a) shows photographs of blade coated perovskite films without or with four categories of surfactants. FIG. 1, panel (b) shows a plane view and cross section view of blade coated perovskite film with or without surfactant added.

Figure 2:
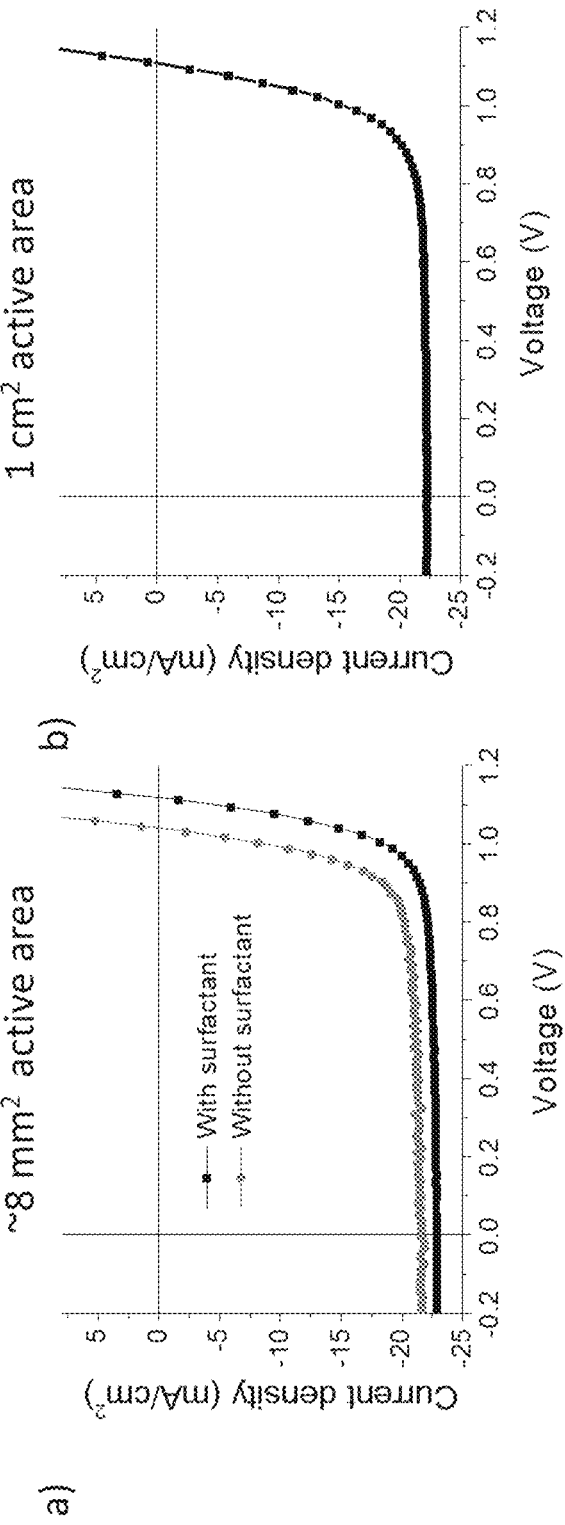

FIG. 2. Panel (a) shows doctor blade coated perovskite solar cells performance with or without surfactant added to the perovskite ink solution. FIG. 2, panel (b) shows large area (1 cm$^2$) blade coated solar cell performance with surfactant added to the perovskite ink solution.

Figure 3:
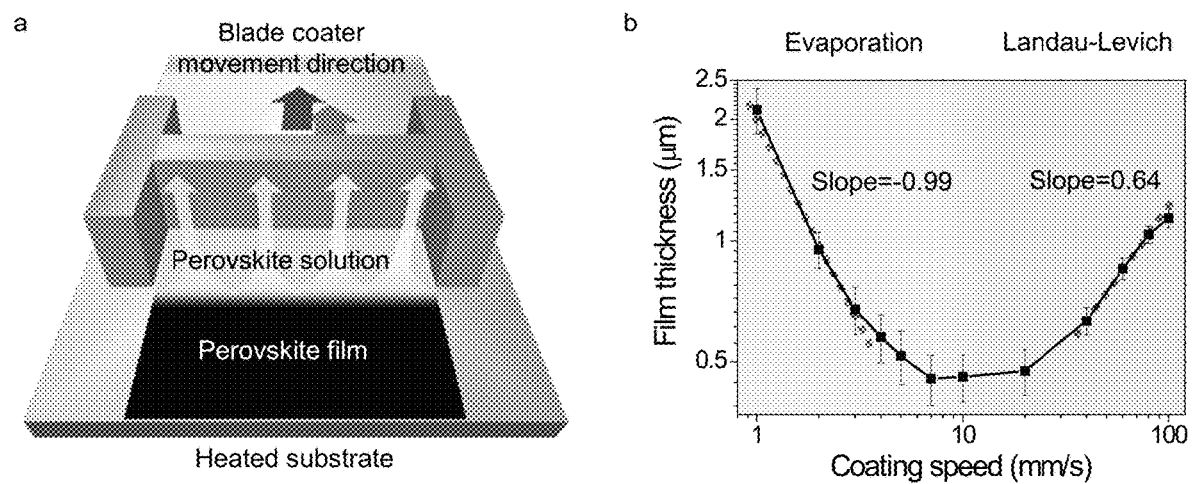

FIG. 3. Principles of blade coating of perovskite films: Panel (a): Schematic illustration for the blade coating of perovskite film in the "Landau-Levich" mode. Panel (b): plot of film thickness versus coating speed. The perovskite films thickness as a function of blade coating speed by coating with a 1 M MAPbI$_3$/DMF solution at 145° C. preheated substrate. The error bars represent root mean square (RMS) roughness of each sample. The red (left) and blue (right) dashed lines represent the linear fittings in the range of 1-3 mm/s and 40-100 mm/s, respectively, with the coefficient of determination being around 0.98.

Figure 4:
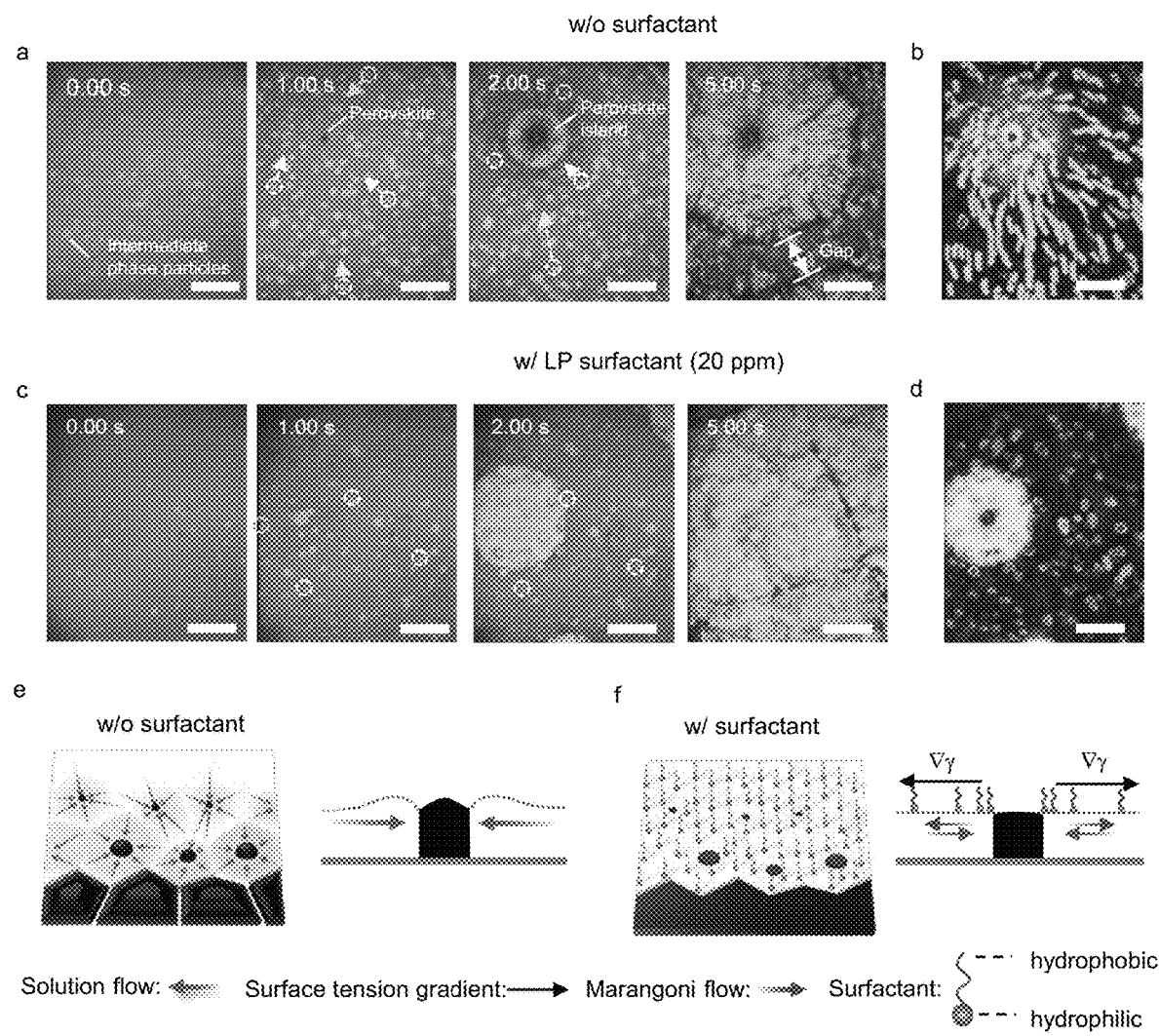

FIG. 4. Solution flow dynamics and its suppression by surfactants. Panel (a): in-situ microscopy images for observation of the ink layer drying dynamics. Several intermediate phase particles are highlighted with dashed circles with different color, and their movement directions are indicated by arrows. Panel (b): stacking video (video accessed at https://static-content.springer.com/esm/art%3A10.1038%2Fs41560-018-0153-9/MediaObjects/41560_2018_153_MOESM3_ESM.mp4) frames from 1.00 s to 2.00 s to show the tracks of perovskite intermediate phase particles without L-α-Phosphatidylcholine (LP) surfactants. Panel (c): Time-stamped frames from a video corresponding to ink layer drying dynamics in the presence of LP surfactant at a concentration of ~20 ppm. Similarly, several intermediate phase particles are highlighted and they remain stationary. Panel (d): stacking video (video accessed at https://static-content.springer.com/esm/art%3A10.1038%2Fs41560-018-0153-9/MediaObjects/41560_2018_153_MOESM4_ESM.mp4) frames from 1.00 s to 2.00 s to show the tracks of perovskite intermediate phase particles in the presence of LP surfactants. The scale bars in these panels are 20 μm. Panel (e): schematic illustration for the directional microscale solution flow towards perovskite island during ink drying. Panel (f): schematic illustration for the suppressed solution flow dynamics in the presence of surfactant.

Figure 5:
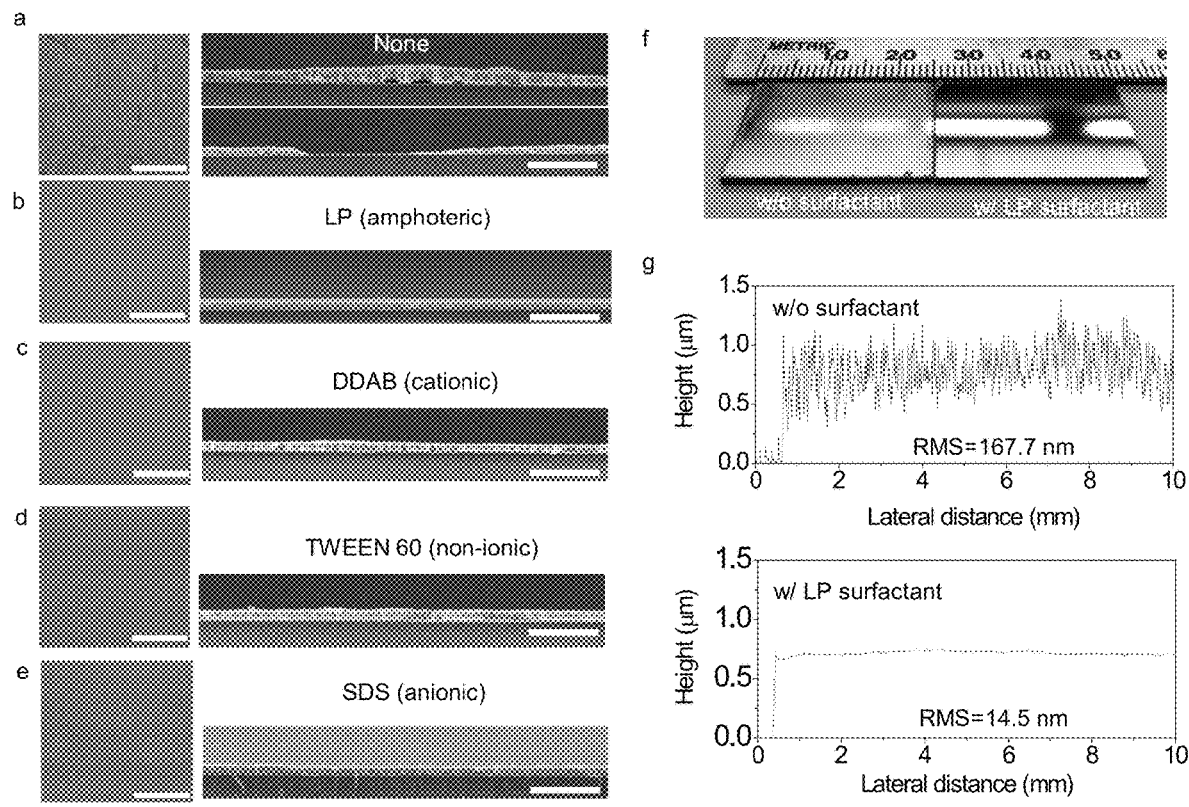

FIG. 5. Morphological characterization of blade coated perovskite films with surfactants. Panels (a-e): Plane view and cross-sectional scanning electron microscopy (SEM) images of blade coated perovskite films without surfactant and with LP, Didodecyldimethylammonium bromide (DDAB), Polyethylene glycol sorbitan monostearate (Tween 60), and Sodium dodecyl sulfate (SDS), respectively. Scale bars for plane view and cross-sectional SEM images are 50 μm and 5 μm, respectively. Panel (f): a photographic image of blade coated perovskite films without and with LP surfactant. Panels (g-h): surface roughness profiling of blade coated perovskite films without and with LP surfactant, respectively.

Figure 6:
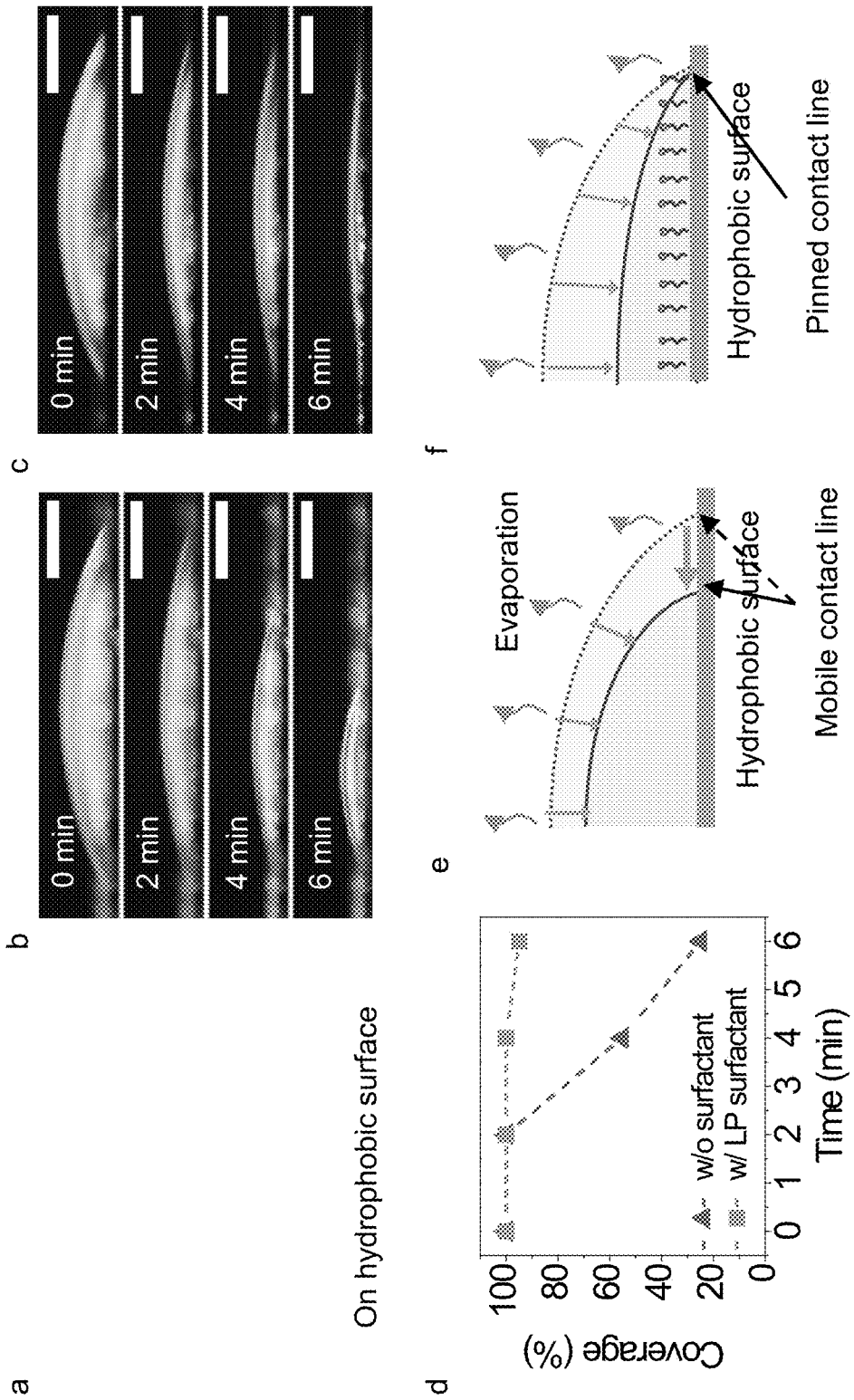

FIG. 6. Wetting improvement of perovskite ink onto hydrophobic substrates by surfactants. Panel (a): blade coated perovskite films on hydrophobic substrates without (left) and with LP surfactant (right). Pabels (b-c): Images corresponding to the drying processes of perovskite ink droplets (~0.5 μl, 0.125 M MAPbI$_3$/DMF) on hydrophobic substrates under ambient condition without and with LP surfactant, respectively. The scale bars are 0.5 mm. Panel (d): A plot of coverage (%) vs. time corresponding to The evolution of coverage of perovskite droplets during drying. Panel (e): schematic illustration for the shrinkage of the ink droplet drying on hydrophobic substrate. Panel (f): schematic illustration for surfactant pinning effect.

Figure 7:
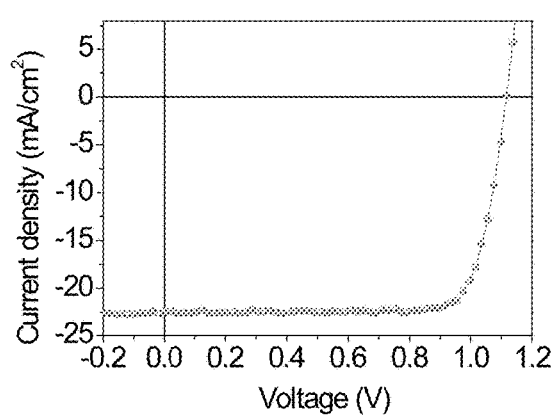
Figure 7:
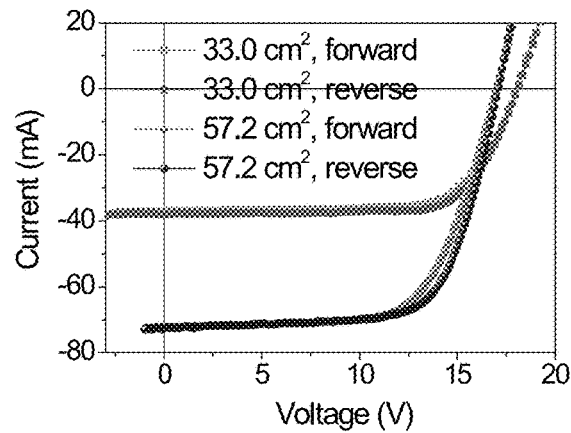
Figure 7:
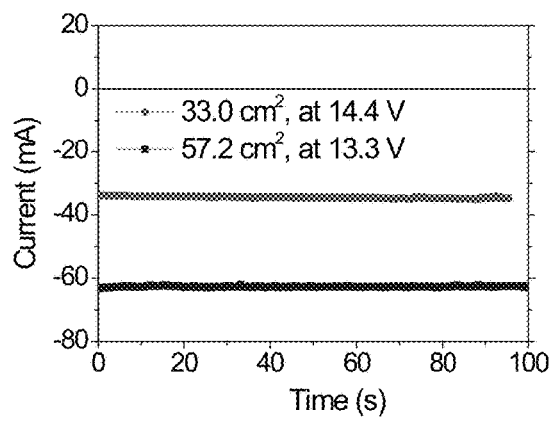
Figure 7:
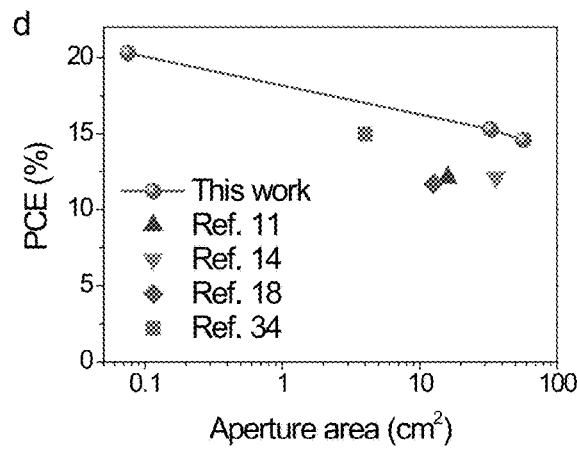
Figure 7:
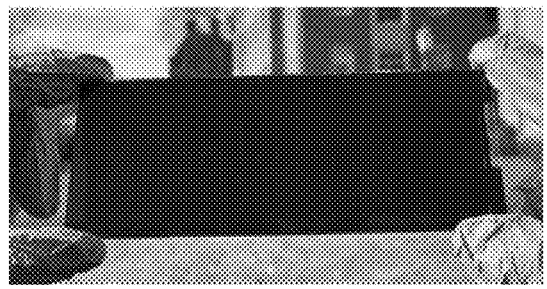
Figure 7:
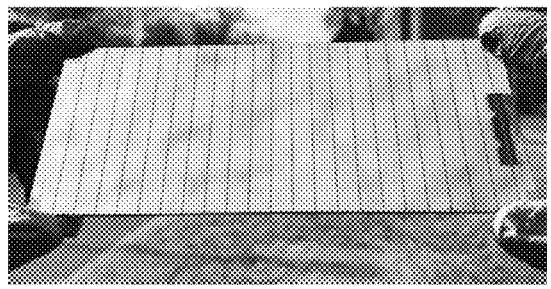

FIG. 7. Characterization of surfactant additive assisted blade coated perovskite solar cell and modules. Panel (a): current density vs. voltage (J-V) scanning plot of a 0.075 cm$^2$ surfactant-assisted blade coated perovskite solar cell. Panels (b-c): I-V (current vs. voltage) scanning curves and stabilized photocurrent output at maximum power point of modules with aperture area of 33.0 cm$^2$ and 57.2 cm$^2$. Panel (b): power conversion efficiency of perovskite solar cells as a function of aperture area from this work and representative most recent reports (see References 11, 14, 18, and 34 corresponding to Example 1a). Panels (e-f): photographic image of a perovskite solar module viewing from glass side (left) and top electrode side (right).

Figure 8:
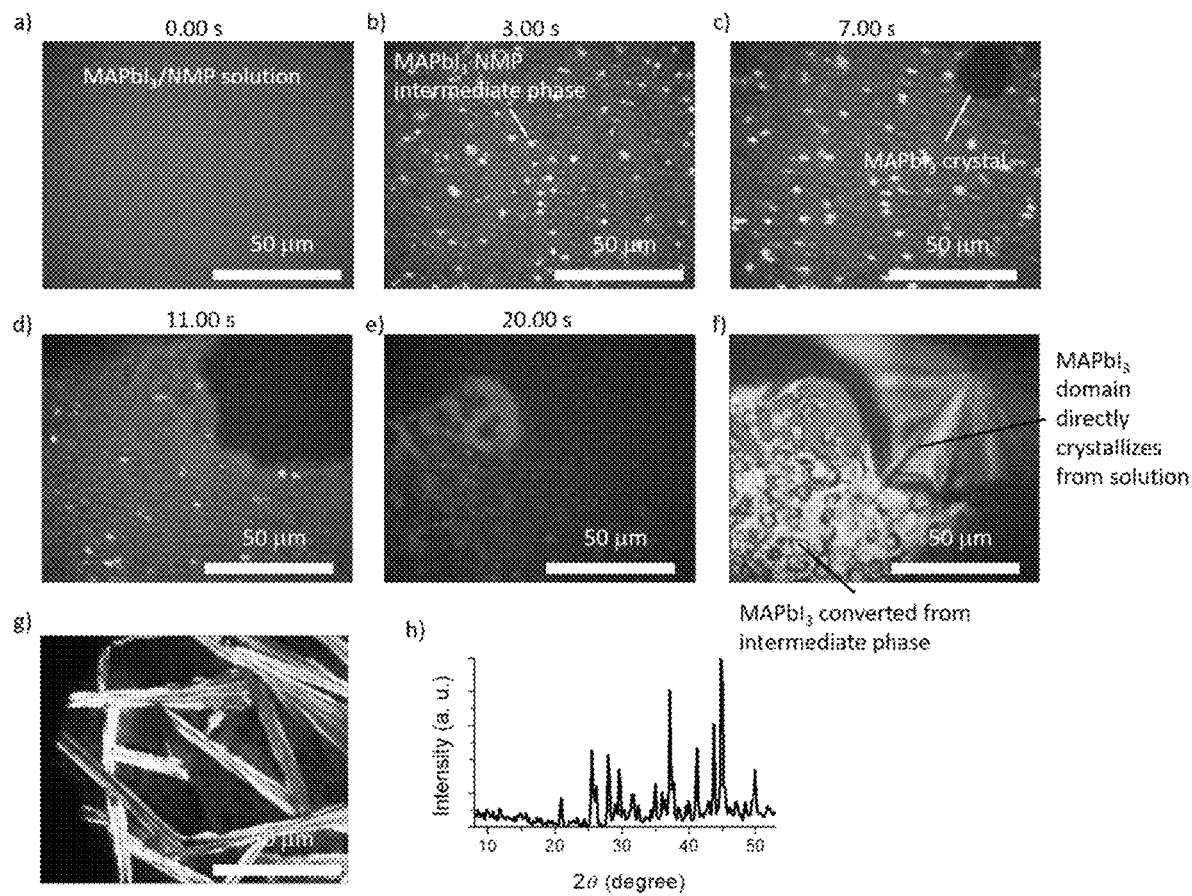

FIG. 8. Panels (a-e): polarized optical microscopy images of 1 M methylammonium lead halide (MAPbI3)/N-Methyl-2-pyrrolidone (NMP) solution during drying at substrate temperature of ~70° C. Panel (f): Reflection mode optical microscopy image at the same position as panel (e) after the solution fully dries. Panel (g): Polarized optical microscopy image of 1 M MAPbI$_3$/N,N-Dimethylformamide (DMF) solution at the middle stage of drying at substrate temperature of ~70° C. Panel (h) X-ray diffraction (XRD) pattern of the microfibers observed in panel (g).

Figure 9:
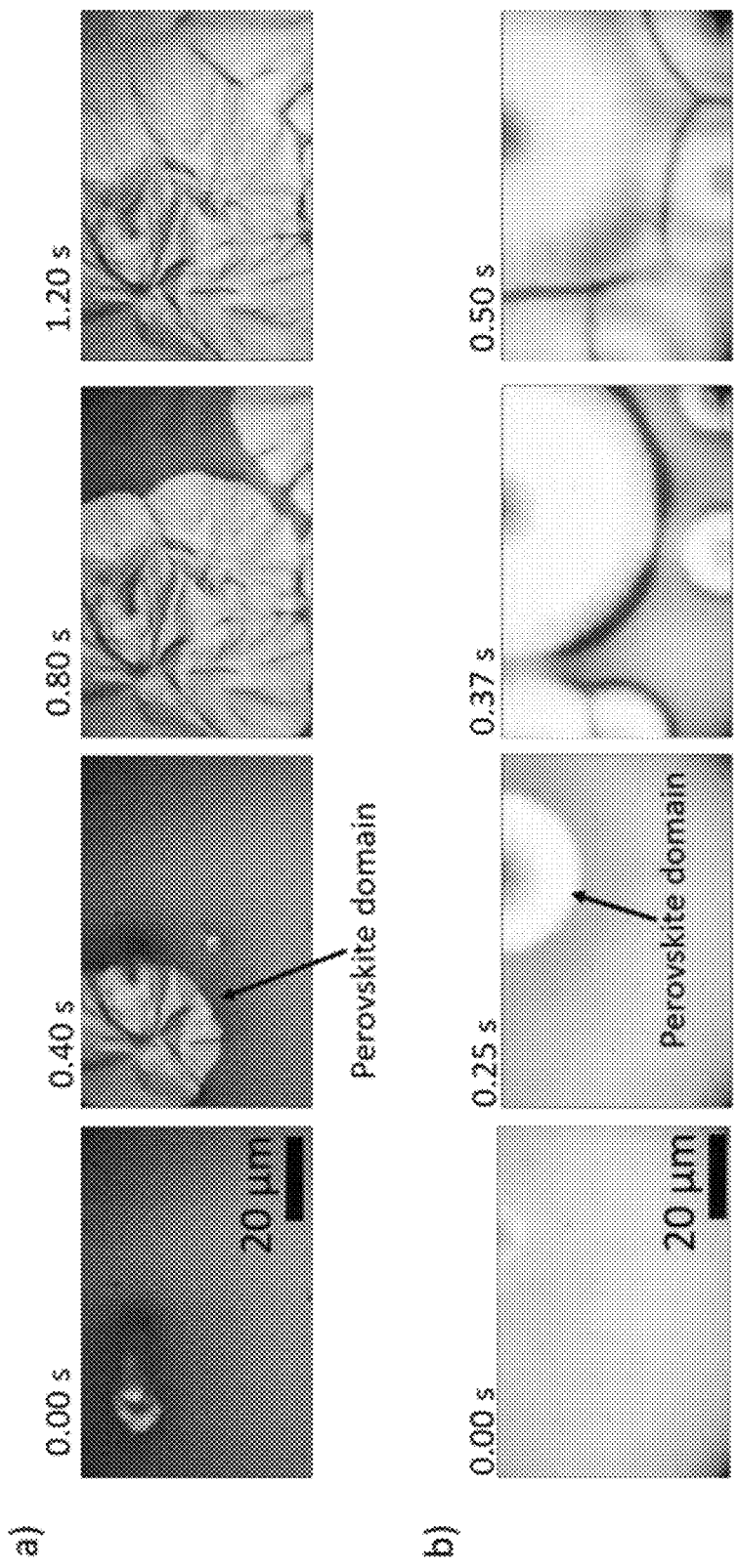

FIG. 9. Times-stamped frames from a video corresponding to in-situ optical microscopy observation of drying ink layers of (panel (a)) 1M MAPbI$_3$/DMSO at 100° C. and (panel (b)) 1M MAPbI$_3$/DMF at 145° C.

Figure 10:
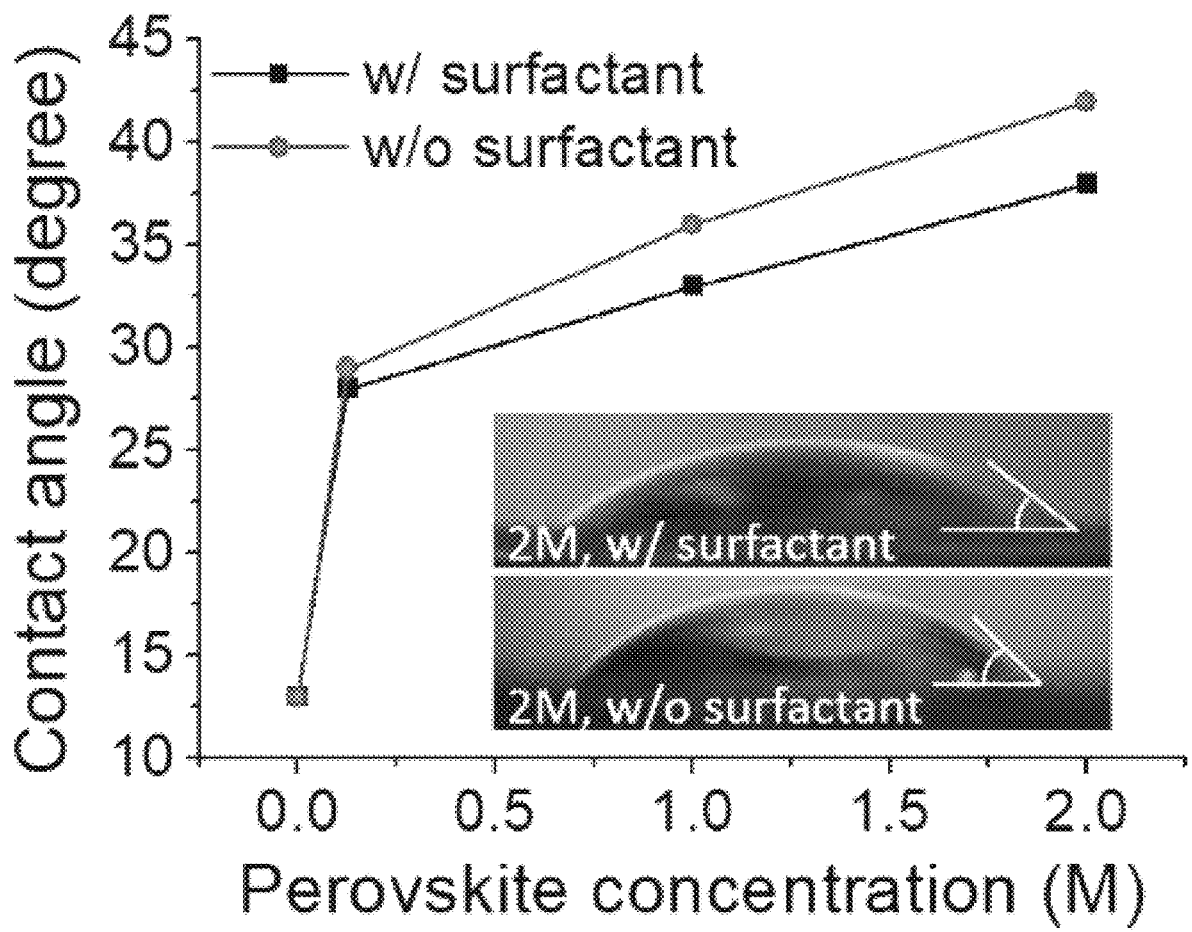

FIG. 10. Contact angle measurement of perovskite solution droplets on PTAA/ITO/glass substrates with and without addition of LP surfactant.

Figure 11:
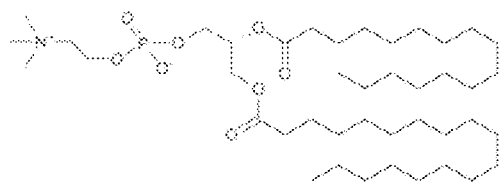
Figure 11:
Figure 11:
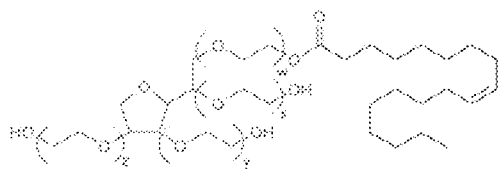
Figure 11:

FIG. 11. Chemical structures of the four exemplary surfactants.

Figure 12:
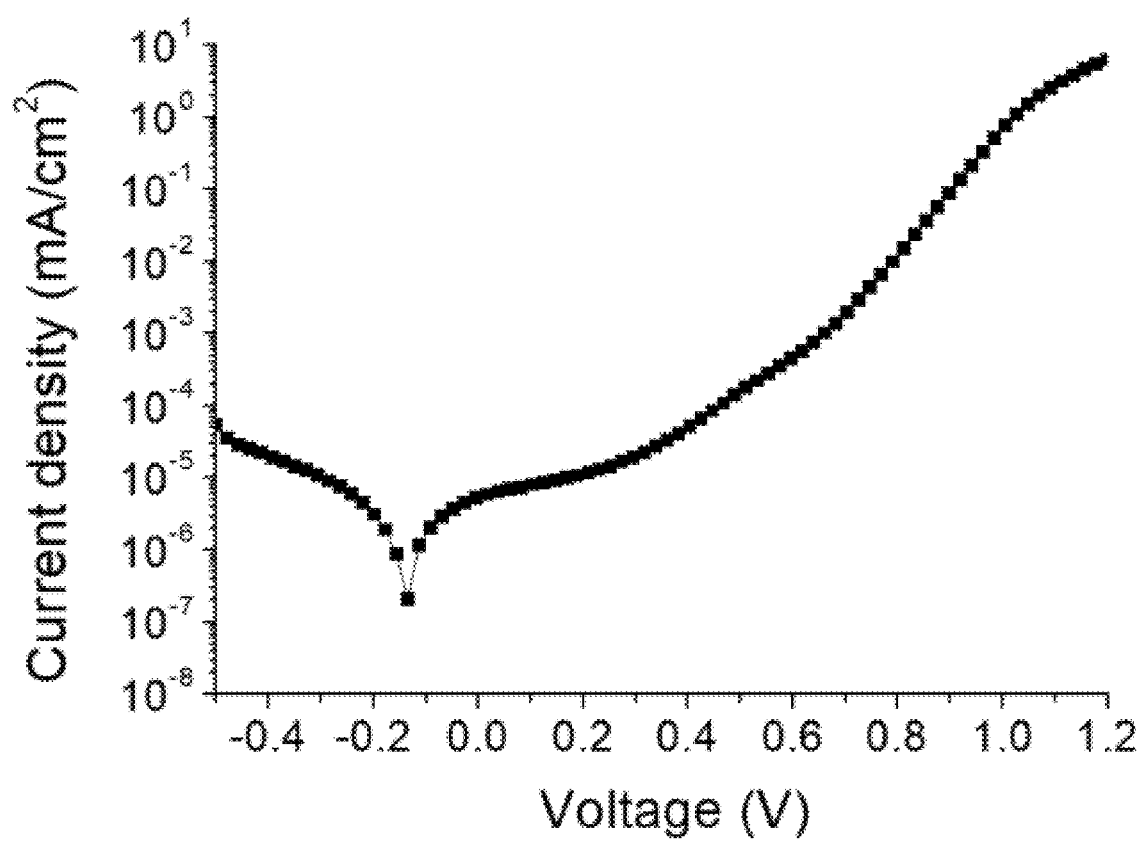

FIG. 12. Dark current density vs voltage scanning for a 1 cm2 perovskite solar cell fabricated with LP surfactant additive.

Figure 13:
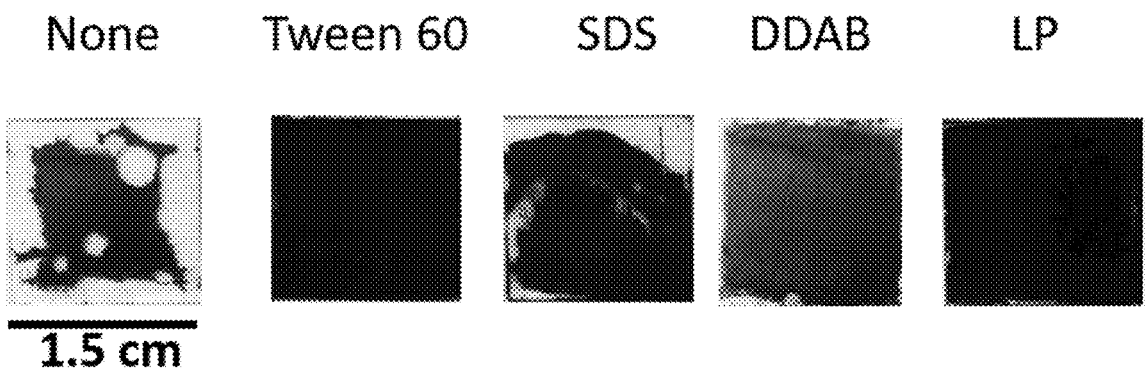

FIG. 13. Photographic images of perovskite films blade coated on PTAA/glass substrates with and with different types of surfactants.

Figure 14:
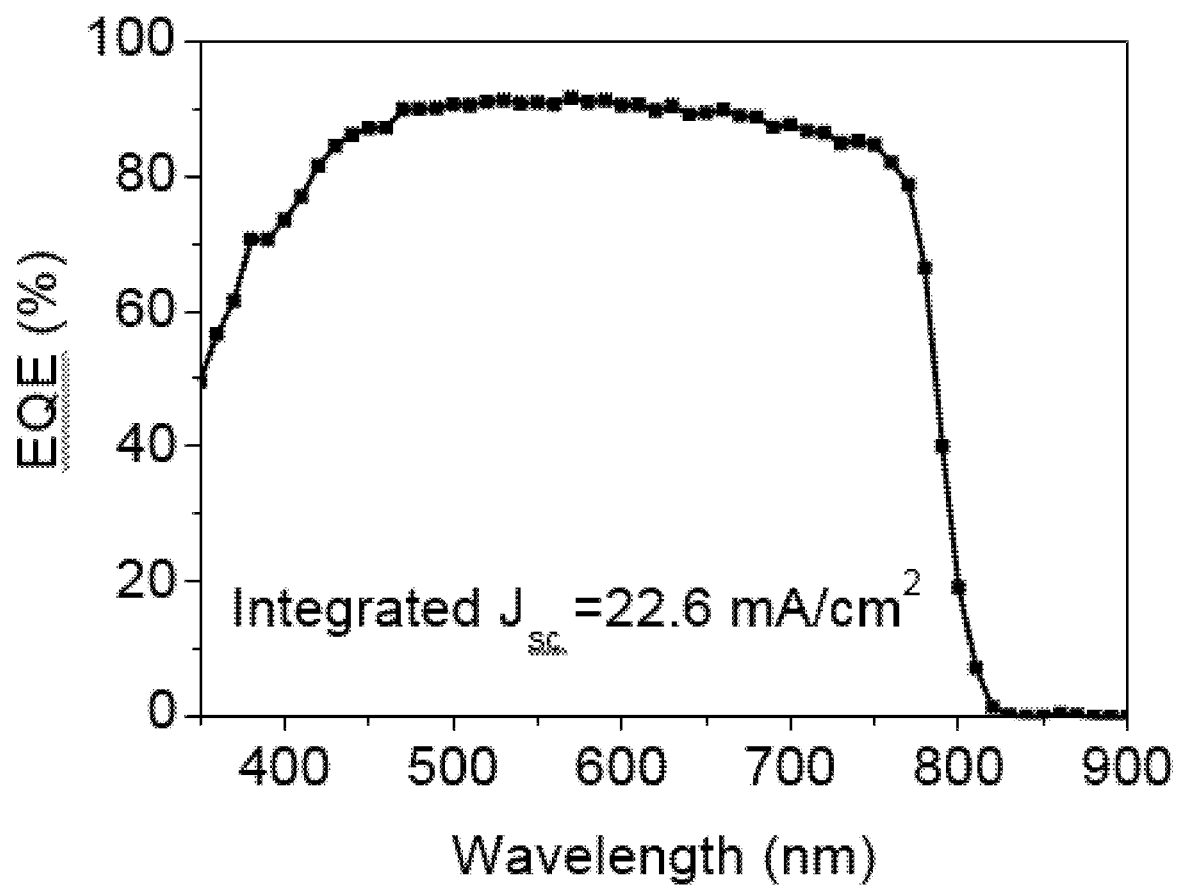

FIG. 14. External quantum efficiency measurement of the perovskite solar cell.

Figure 15:
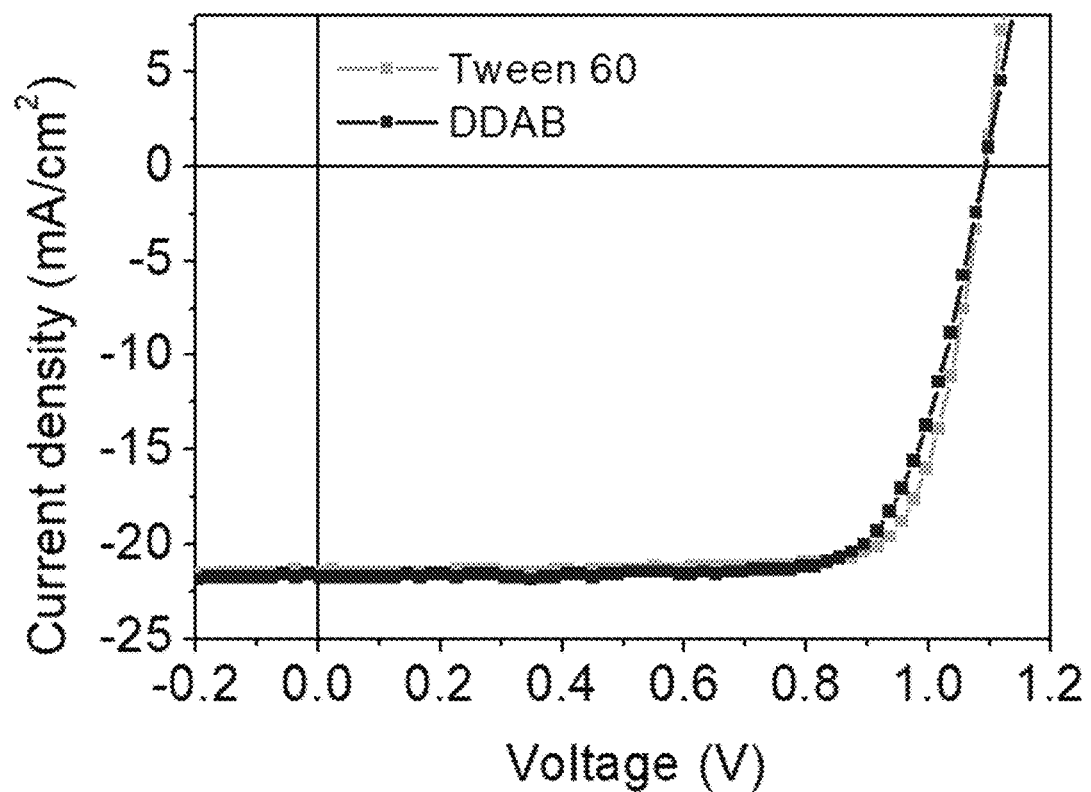

FIG. 15. Small area device performances using Tween 60 and DDAB as surfactant additives.

Figure 16:
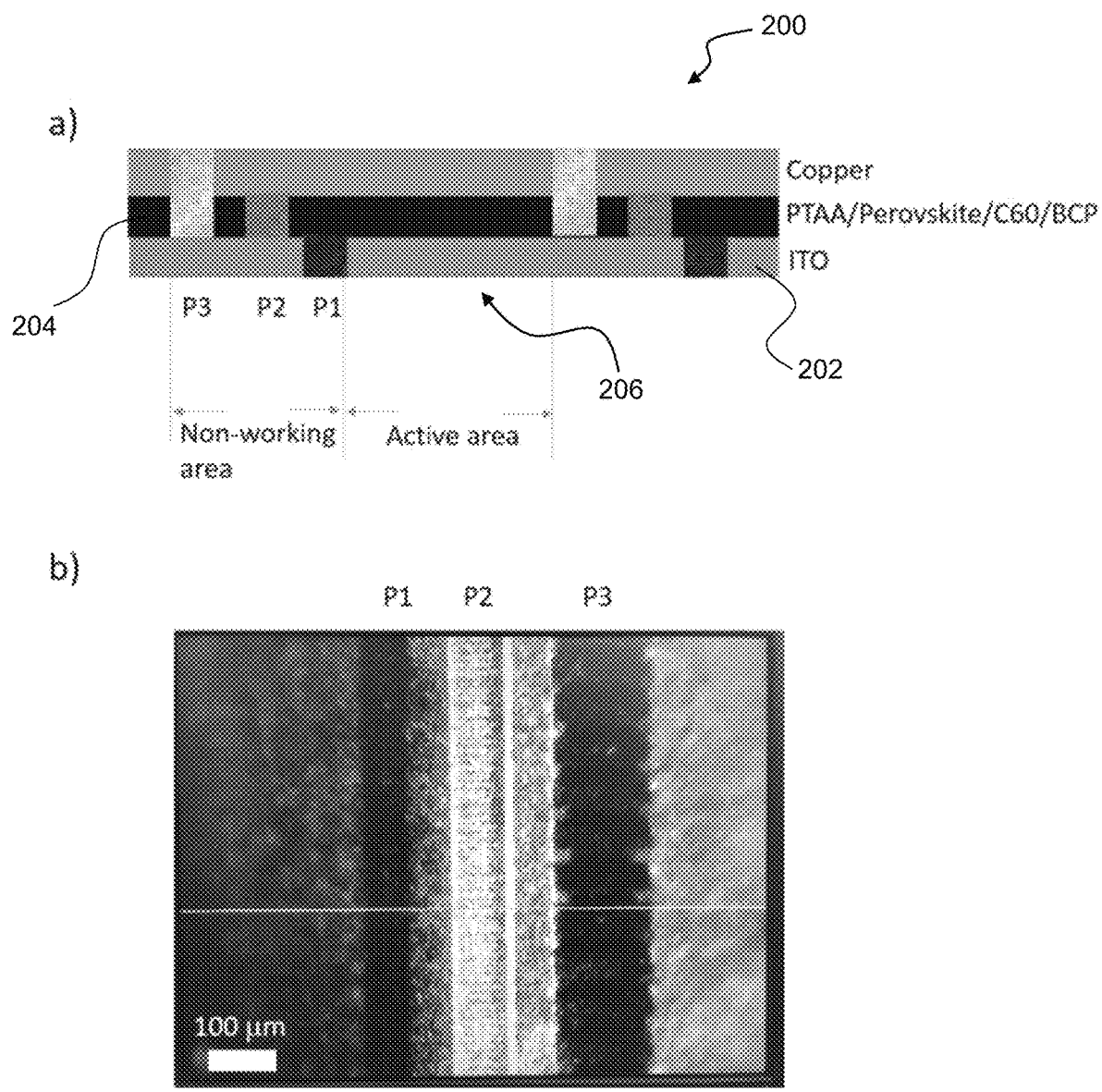

FIG. 16. Panel (a): p1-p2-p3 pattern of a perovskite solar module. Panel (b): optical microscopy image of the p1-p2-p3 pattern fabricated.

Figure 17:
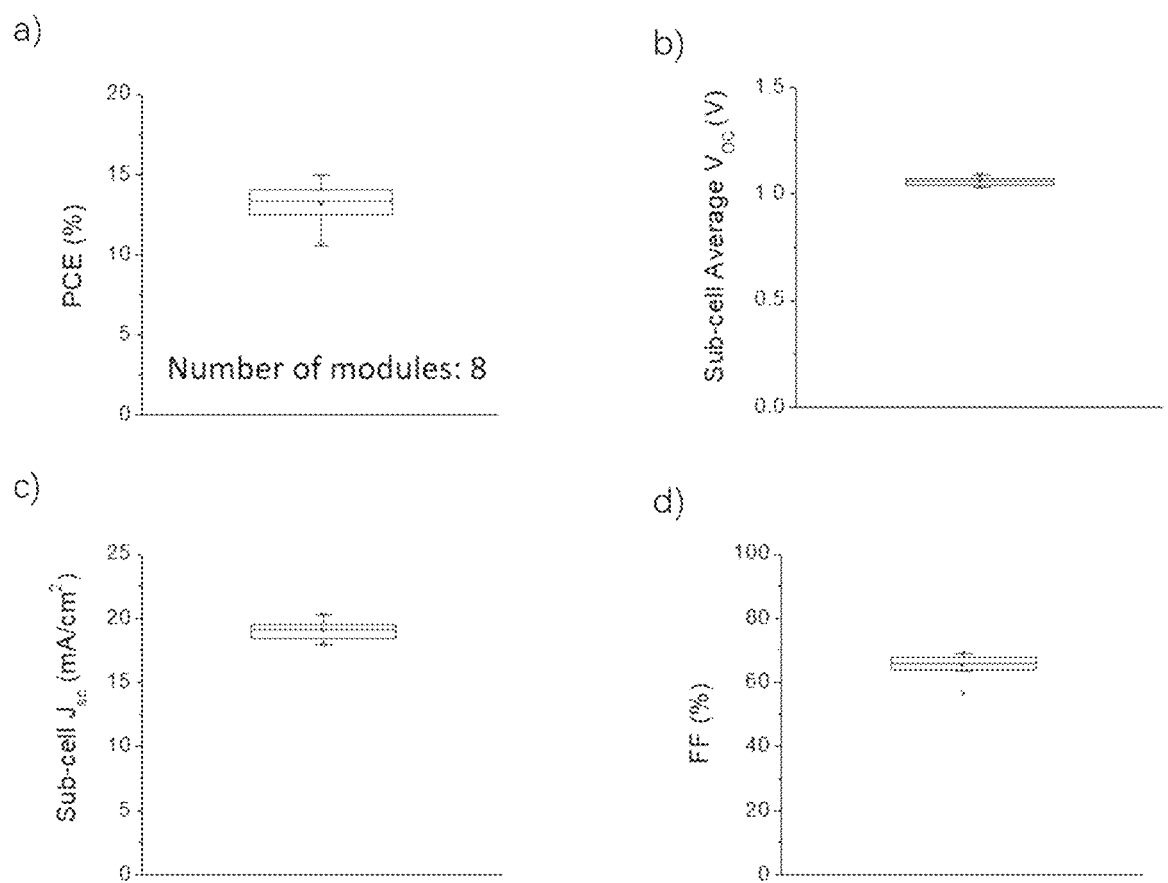

FIG. 17. Panels (a-d): statistics of PCE (power conversion efficiency), FF (fill factor), and sub-cell equivalent $V_{OC}$ (open circuit voltage) and $J_{SC}$ (short circuit current) of 8 modules with aperture area ~57.2 cm$^2$.

Figure 18:
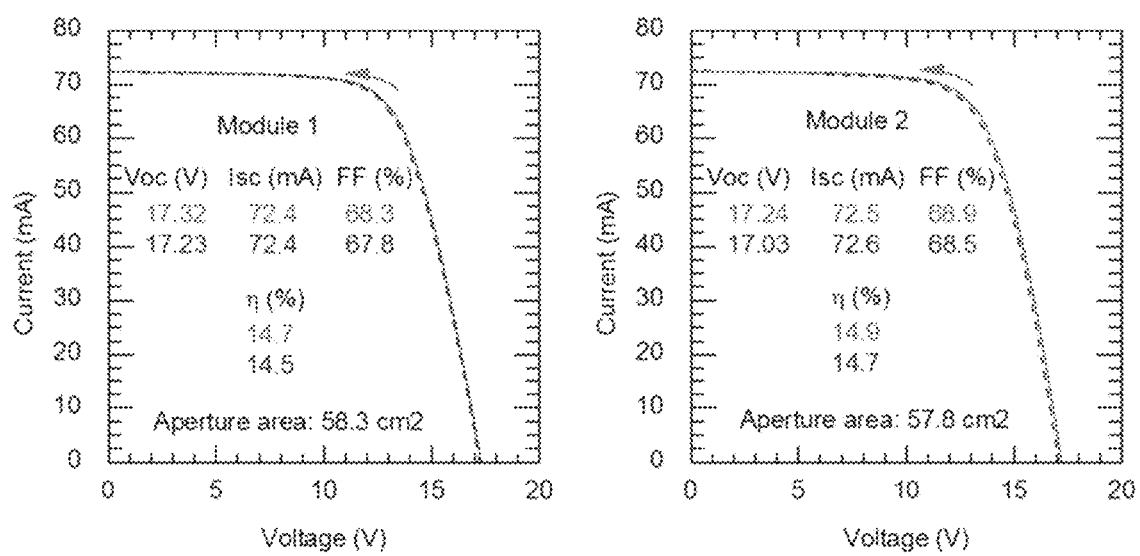

FIG. 18. Calibrations and measurements performed, for verification, on photovoltaic devices made according to the present embodiments.

Figure 19:
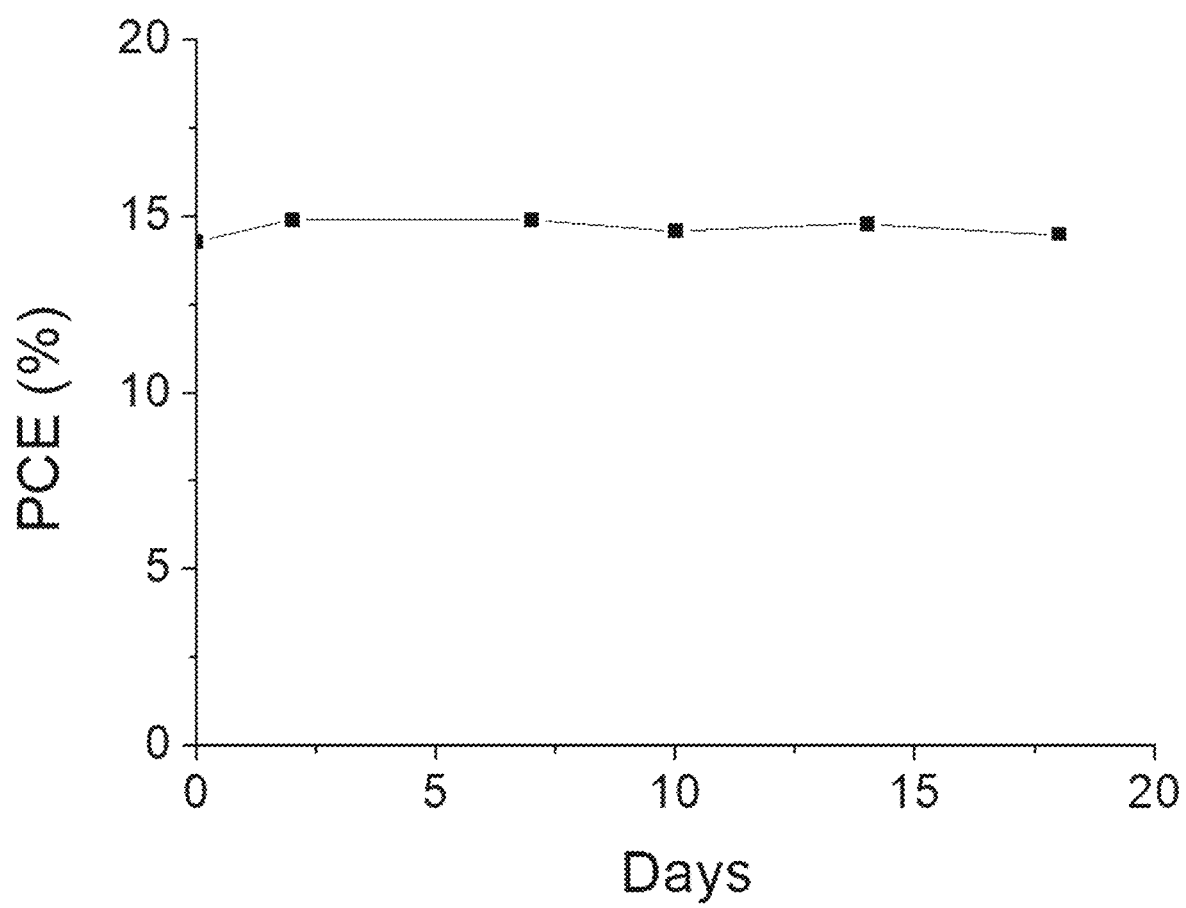

FIG. 19. Shelf stability of a photovoltaic cell, according to an embodiment, stored in dark in $N_2$ to demonstrate stability against degradation.

Figure 20:
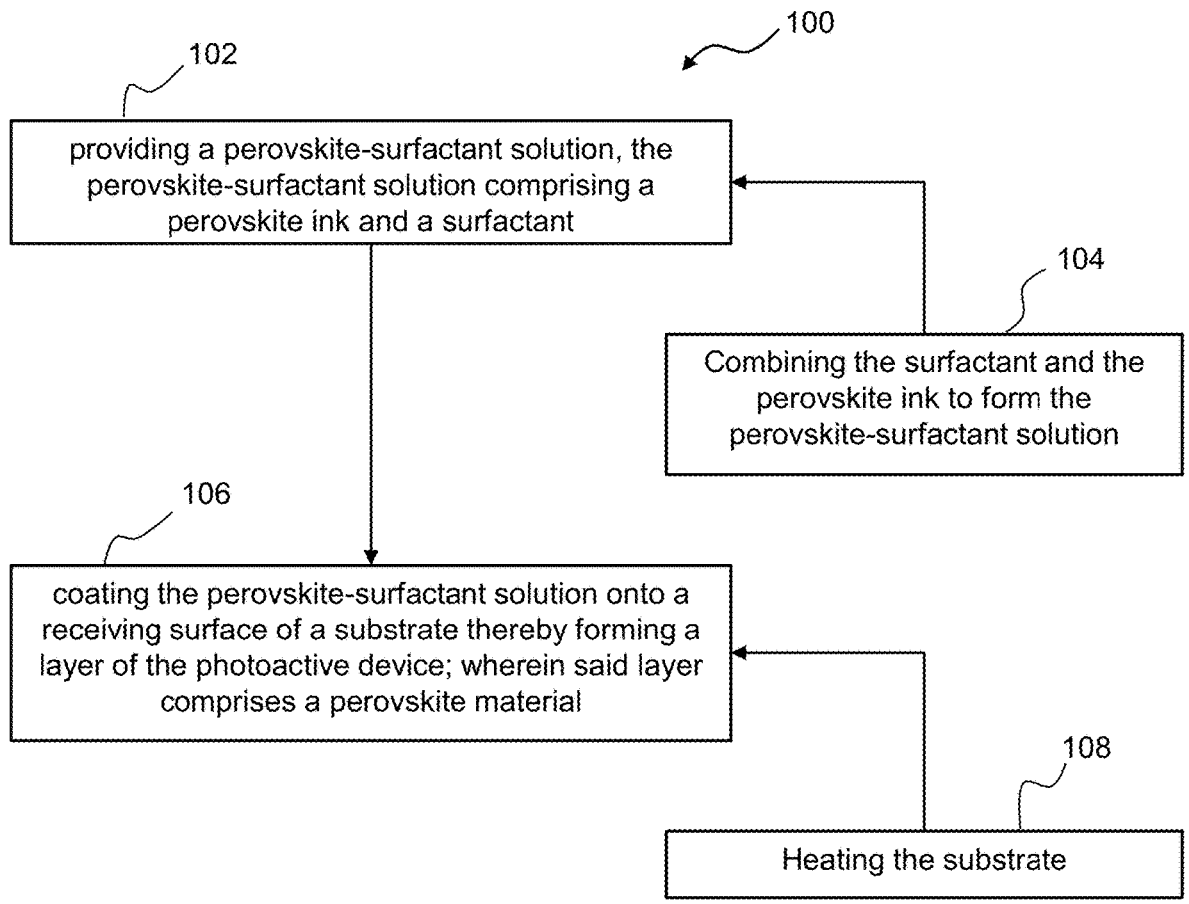

FIG. 20. Schematic of a method for forming a photoactive device.

STATEMENTS REGARDING CHEMICAL COMPOUNDS AND NOMENCLATURE

In general, the terms and phrases used herein have their art-recognized meaning, which can be found by reference to standard texts, journal references and contexts known to those skilled in the art. The following definitions are provided to clarify their specific use in the context of the invention.

The term "photoactive device" refers to (i) a device capable of and configured to converting electromagnetic radiation (e.g., X-ray, infrared, ultraviolet, and/or visible light) to electrical energy and/or converting electrical energy to electromagnetic radiation. A photoactive device may be configured to both convert light to electrical energy (e.g., as a solar cell) and convert electrical energy to light (e.g., via electroluminescence), for example depending on the direction of electrical current in the device (e.g., depending on whether electrical power is withdrawn from or supplied to the device). Exemplary photoactive devices include, but are not limited to, a photovoltaic cell (also referred to as a solar cell), a photodiode, and a light emitting diode (LED). In some embodiments, a photoactive device may also refer to a device configured to change its optical, physical, and/or electrical properties with change in its exposure to electromagnetic radiation and/or a device configured to change its optical properties in response to a change in input of electrical energy. Exemplary photoactive devices may also include, but are not limited to, a photoresistor, phototransistor, photomultiplier, photoelectric cell, and an electrochromic cell.

The term "active layer" refers to a layer, of a photoactive device, which absorbs the photons that are converted to electrical energy or which emit the photons which are formed in response to input electrical energy. In a photovoltaic cell, an active layer may also be referred to as an absorber layer. A photoactive device may have more than one active layer. In some embodiments, an active layer of a photoactive device is a perovskite layer, or layer including a perovskite material.

The term "active area" refers to an area of a photoactive device. In the case of a photoactive device that is converting electromagnetic radiation to electrical energy, the active area refers to the area of the device that is exposed to and absorbs the photons which are converted to electrical energy. In the case of a photoactive device that is converting electrical energy to electromagnetic radiation, the active area refers to the area of the device that is emitting electromagnetic radiation induced by the electrical energy put into the device. In some embodiments, the area refers to a surface area. The active area of a photoactive device, such as of a photovoltaic cell, may be measured by any conventional technique used in the art to measure the active area of a photoactive device, including techniques known by those of skill in the art of photovoltaics. In some embodiments, the active area corresponds to the area of an aperture when an aperture is used to limit the area of the photoactive device that is exposed to incident electromagnetic radiation, for conversion of electromagnetic radiation to electrical energy. For example, an area of a photovoltaic cell may be 110.5 $cm^2$ (e.g., area corresponding to the area capable of absorbing electromagnetic radiation and converting it to electrical energy), but an aperture is positioned between the photovoltaic cell and the incident light source to limit the light-exposed-area of the photovoltaic cell to an area of 58.3 $cm^2$, such that the active area of this photovoltaic cell is 58.3 $cm^2$ rather than 110.5 $cm^2$. (An aperture may be used to limit the illuminated area to minimize edge effects and other artifacts, for example.) In some embodiments, a plurality of individual photovoltaic cells are exposed to incident light through an aperture area, but only a select one or more of the light-exposed photovoltaic cells produce electrical energy or have its produced electrical energy measured via an electrical circuit external to the photovoltaic cell (e.g., an individual cell is connected to a circuit and is actively flowing charge carriers (electrical current) among the anode, an electrical circuit, and cathode). For example, a total of 17 photovoltaic cells, each individual cell having an area of 1.95 $cm^2$, may be exposed to incident light (optionally through an aperture) such that a total area of illuminated photovoltaic cells is 33.0 $cm^2$, where the active area of each individual photovoltaic cell is 1.95 $cm^2$. For example, a total of 16 photovoltaic cells, each individual cell having an area of 3.575 $cm^2$, may be exposed to incident light (optionally through an aperture) such that a total area of illuminated photovoltaic cells is 57.2 $cm^2$, where the active area of each individual photovoltaic cell is 3.575 $cm^2$. In some embodiments, a plurality of individual photovoltaic cells are illuminated simultaneously and are electrically connected (e.g., in series or parallel) such that electrical energy is extracted from the plurality of individual photovoltaic cells simultaneously; in this case, the active area corresponds to the sum of the active areas of each of the plurality of individual cells. In some embodiments, the active area refers to the device area that undergoes change in optical, physical, and/or electrical properties with change in its exposure to electromagnetic radiation or the device area that undergoes change in optical properties in response to a change in input of electrical energy (e.g., the portion of the electrochemical cell undergoing change in color in response to voltage).

The term "photovoltaic efficiency", also known in the art as "power conversion efficiency" and solar cell efficiency, refers to the ratio of energy output from the photovoltaic device to the energy input to the photovoltaic device. The energy output is in the form of electrical energy and energy input is in the form of electromagnetic radiation (e.g., sunlight). Unless otherwise indicated, the photovoltaic efficiency refers to terrestrial photovoltaic efficiency, corresponding to AM1.5 conditions, where AM is Air Mass.

The term "continuous-type coating" refers to a coating method compatible with continuous or roll-to-roll film deposition. In some embodiments, a continuous-type coating method refers to a coating method for deposition of solid film(s) from liquid solution(s) and which is compatible with a continuous or roll-to-roll film deposition. In some embodiments, a continuous-type coating method is one that is not a batch-type coating method. Exemplary continuous-type coating methods include, but are not limited to, blade coating, die coating, slot die coating, slide die coating, gravure coating, shear coating, spray coating, inkjet printing, curtain coating, bead coating, screen printing, flexographic printing, immersion dip coating, metering rod coating, roller coating, silk screen coating, extrusion coating, slot die bead coating, and any combination thereof. Spin coating is an exemplary batch-type coating method.

A "perovskite ink" is a solution comprising at least one solvent and at least one perovskite material or a material that forms a perovskite material upon deposition.

The term "substantially" X, "substantially equal to" X, or "substantially equivalent to" X, when used in conjunction with a reference value X describing a property or condition, refers to a value that is within 10% (e.g., within 10%, optionally within 5%, optionally within 1%), or is equivalent to the provided reference value X. For example, a molar ratio is substantially equal to 3.125e-4 if the molar ratio is a value within 10% (e.g., within 10%, or optionally within 5%, or optionally within 1%) or optionally equivalent to 3.125e-4.

In an embodiment, a composition or compound in an embodiment, such as an alloy or precursor to an alloy, is isolated or substantially purified. In an embodiment, an isolated or purified compound is at least partially isolated or substantially purified as would be understood in the art. In an embodiment, a substantially purified composition, compound or formulation may have a chemical purity of 95%, optionally for some applications 99%, optionally for some applications 99.9%, optionally for some applications 99.99%, and optionally for some applications 99.999% pure.

DETAILED DESCRIPTION

In the following description, numerous specific details of the devices, device components and methods of the present invention are set forth in order to provide a thorough explanation of the precise nature of the invention. It will be apparent, however, to those of skill in the art that the invention can be practiced without these specific details.

According to certain embodiments, methods of forming a perovskite active layer are provided, wherein a perovskite-surfactant solution comprising a perovskite material dissolved in a solvent with an added surfactant is applied to or coated on a substrate to improve surface coverage and/or smoothness of the perovskite film. In certain aspects, such methods are advantageous for substrates having hydrophobic properties or insufficient hydrophilic properties to enable a sufficiently uniform coating of the perovskite solution without the surfactant. It should be appreciated, though, that such methods are also useful for any substrate, including hydrophilic substrates, to improve the surface coverage and/or smoothness of the substrate. For example, in one embodiment, in a first step, a perovskite solution is provided or acquired. In a second step, a surfactant is added to the perovskite solution to form a perovskite-surfactant solution. In a third step, the perovskite-surfactant solution is applied to or coated onto a substrate to form a thin perovskite film on the substrate. Additional device layers such as anode/cathode layer(s), hole transport layers, electron transport layers, etc. may be formed on the perovskite film, depending on the ultimate device configuration desired. Intermediary heating, drying and other steps may be performed as needed depending on the materials used. The processes disclosed herein are useful for forming perovskite films on substrates to form substantially uniform perovskite film layers or sheets having dimensions ranging from the order of mm$^2$ to cm$^2$ to m$^2$ or greater.

According to certain embodiments, adding surfactant to a perovskite solution (e.g., perovskite ink) is performed using a concentration typically in the range of 0.01-1 mM. The added surfactant advantageously enhances the wetting of perovskite solution to a substrate to produce uniform perovskite films. The concentration range may be larger or smaller as appropriate for the particular application and materials used. The relatively small amount of surfactant added has little or no detrimental effect to the optoelectronic properties of coated perovskite films. Additionally, certain surfactants such as L-α-Phosphatidylcholine will passivate the charge traps. Such method results in coating (e.g., blading) of large area perovskite films with excellent uniformity and high efficiency devices, e.g., above 19.6% for 8 mm$^2$ area cell and 18.2% for 1 cm$^2$ area cells. In addition, the surfactant can self-assemble on the surface of the perovskite film, forming a hydrophobic layer that improves the stability of a device incorporating the perovskite layer (e.g., solar cell) against moisture.

The surfactant can be any of a variety of surfactants belonging to the four categories of surfactants: non-ionic (e.g., tween 60), amphoteric (zwitterionic) (e.g., L-α-Phosphatidylcholine, LP), anionic (e.g., Sodium dodecyl sulfate, SDS) and cationic surfactants (e.g., cetyltrimethylammonium bromide, CTAB). The perovskite solution can be composed of any solution-processable photoactive perovskite material or materials that include, but are not limited to, methylammonium lead halide, formamidinium lead halide, cesium lead halide, methylammonium tin halide, formamidinium tin halide, cesium tin halide and any combination thereof. For example, the perovskite material may comprise organometal trihalide perovskite having the formula $ABX_3$, or $A_2BX_4$, wherein A is methylammonium ($CH_3NH_3^+$), formamidinium ($H_2NCHNH_2^+$), or an alkali-metal ion, B is a metal cation, and X is a halide anion, thiocyanate (SCN—) or a mixture thereof. Additionally, the perovskite material may include a mixed halide composition. The solvents include, but are not limited to, Dimethylformamide, Dimethyl sulfoxide, gamma-Butyrolactone, N-Methyl-2-pyrrolidone, 2-Methoxyethanol and other solvents that can dissolve aforementioned perovskite materials.

The perovskite layer coating methods are generally roll-to-roll processes and include, but are not limited to, doctor blade coating, slot die coating, gravure coating, shear coating, spray coating, inkjet printing, spin-coating, etc. The coating speed is variable from 1 m/min or less to 1000 m/min or greater. The substrate for perovskite solution coating can be either hydrophilic or hydrophobic and may include, but is not limited to, metal, metal oxide, polymer, small molecule or other compounds. Specific examples include ITO, FTO, AZO or other conductive transparent electrode material on a rigid or flexible substrate.

FIG. 1, panel (a) compares the blade coated perovskite films on hydrophobic substrates (glass coated with poly(bis (4-phenyl)(2,4,6-trimethylphenyl)amine) (PTAA)) with and without surfactant (control sample). Blade coating is performed as known. The film with surfactant covers the substrate uniformly while the control film has a severe de-wetting problem, leaving a large area uncovered. Using scanning electron microscopy (FIG. 1, panel (b)), it can be seen that the control sample has many cell-like domains that makes a rough perovskite film. The domain structure could have pin-holes at the domain boundary as is shown by the cross-section SEM of the control sample. In sharp contrast, when surfactant is added into the perovskite ink, the domain structure almost disappears. The blade coated perovskite film can then be thin enough and continuous such that is ideal for PSC applications.

Almost all surfactants from the four categories (i.e. non-ionic, amphoteric, anionic and cationic surfactants) with different molecular structure have the dual functionalities of improving coverage and reducing roughness. The results showed that it is the surfactant property but not specific functional groups that play the role. Surfactants tend to self-assemble on interfaces where there is surface energy mismatch (e.g. substrate/solution and solution/air interfaces). Their hydrophilic groups adsorb to a high-energy surface while their hydrophobic groups align to a low energy surface. It is believed that the surfactants at interfaces improve coating quality.

The blade coated perovskite solar cell performance with and without surfactant is compared in FIG. 2, panel (a). When surfactant is added, all device parameters including $J_{sc}$, FF and $V_{oc}$ increase as compared to the device without surfactant, and the power conversion efficiency increases from 16.9% to 19.6%. Also, a large area device with surfactant is shown in FIG. 1B with efficiency of 18.2%.

FIG. 20 is a schematic of an exemplary method 100 for forming a photoactive device. Method 100 includes steps 102-108. In step 102, a perovskite-surfactant solution is provided. The perovskite-surfactant solution comprises a perovskite ink and a surfactant. Step 104 is optional and includes combining the surfactant and the perovskite ink to form the perovskite-surfactant solution. In step 106, the perovskite-surfactant solution is coated onto a receiving surface of a substrate thereby forming a layer of the photoactive device, wherein the layer comprises a perovskite material. Step 108 is optional and includes heating the substrate during the coating step.

Panel (a) of FIG. 16 is a cross-sectional schematic of an exemplary photoactive device 200, which is a photovoltaic cell. Device 200 includes a substrate 202, which may be indium tin oxide (ITO) coated glass. Device 200 includes a layer 204 above substrate 202, where layer 204 includes a perovskite material. Layer 204 may be, and is preferably, an active layer of photoactive device 200. Additional layers may be included in device 200, such as layers that facilitate electron injection or hole injection into layer 204, thereby facilitating the conversion of electromagnetic radiation into electrical energy (or vice versa). Device 200 also includes an active area 206. Active area 206 may be formed via the arrangement or configuration of the device 200, which include scribing one or more layers to define pathways for electrical current, for example as shown in panel (a) of FIG. 16. The active area may further, or alternatively, be defined via use of an aperture to limit the area illuminated by electromagnetic radiation.

Example 1a: Surfactant-controlled ink drying enables high-speed deposition of perovskite films for efficient photovoltaic modules.

Novel photovoltaic technologies such as perovskites hold the promise of reduced levelized cost of electricity, but the low cost potential depends on the ability to scale-up solution-based deposition. So far, complex fluid dynamics have limited the solution deposition of uniform pinhole free organic-inorganic perovskite thin films over large areas. Here, it is shown that very small amounts of one or more surfactants (e.g. L-α-Phosphatidylcholine), at tens part-per-million level, dramatically alter the fluid drying dynamics and increase the adhesion of the perovskite ink to the underlying non-wetting charge transport layer. The additives enable blading of smooth perovskite films at a coating rate of up to 180 meters per hour or more with root-mean-square roughness of 14.5 nanometers over 1 cm. The surfactants also passivate charge traps, resulting in efficiencies over 20% for small area solar cells. Fast blading in air of perovskite films results in stabilized module efficiencies of 15.3% and 14.6% measured at aperture areas of 33.0 cm$^2$ and 57.2 cm$^2$, respectively.

Perovskite solar cells (PSCs) have joined the highly efficient photovoltaic league as the youngest member.[1-4] After demonstration of very high power conversion efficiency over 20% for small area devices in laboratories,[5-8] the another question is whether the high efficiency lab cells can be translated or scaled to solar modules with minimal efficiency loss in industrial scale high-throughput production. One significant advantage of perovskite materials is their solution process capability, which allows perovskite solar panels to be manufactured by scalable and low-cost vacuum-free processes. However, most of the reported efficient PSCs were still fabricated by spin-coating, a process with low throughput and limiting cell size to about 1 cm$^2$. Scalable coating methods for the perovskite layers have been explored for in the past few years, such as spray-coating,[9-11] electrochemical deposition,[12] soft-cover deposition,[13,14] doctor-blade coating,[15-19] and slot-die coating.[20-22] Among them, blade coating as a continuous fabrication process has been one of the most successful methods due to its simplicity and versatility, making it easily adopted in research laboratories.[16,18] Blade coating was first introduced for PSC fabrication in 2015 with a highest reported device efficiency of ~15.0%,[16] and the efficiency was quickly increased to over 19.0% for small area (~0.1 cm$^2$) solar cells by perovskite composition engineering.[18,23] In addition, the blade coating has close analogy to several industrial-level high-through coating techniques, such as slot-die coating and gravure coating, and thus can be translated into more sophisticated roll-to-roll coating. Despite the promising progress made for small area devices by blade coating, a much larger variation of device performance for the bladed devices was generally observed than for spun devices. The non-uniformity of the bladed films makes it very challenging to fabricate efficient large area perovskite solar cells, while the reported efficiencies for spun larger area (~1 cm$^2$) perovskite devices are close to 20%.[3,4] The non-uniformity of the bladed films may be caused by the inherent solution flow dynamics,[19,24] which is not present in the spin-coating process, because the blade-coating is generally done at higher temperature than spin-coating. In addition, the charge transport layer underlying the perovskite film, such as poly(bis(4-phenyl) (2,4,6-trimethylphenyl) amine (PTAA) and Poly(3-hexylthiophene-2,5-diyl) (P3HT), while required to achieve high PCE, imposes a significant challenge for blade coating of continuous perovskite films. Indeed, they are typically non-wetting to perovskite solution, which reduces the adhesion of the perovskite solution to the underlying layer during the drying process.

As disclosed herein, the application of a small amount of surfactant additive at the level of approximately 20 parts per million (ppm) into the perovskite ink solution can alter the solution flow dynamics and enhance the adhesion of the perovskite solution to very hydrophobic hole transport materials. Surfactants from a variety of category were tested to be effective. The additives enable the coating of uniform perovskite films over large area at a high blade coating rate of 180 meter per hour (m/h). The very small amount of surfactant additive has no detrimental effect to the optoelectronic properties of bladed perovskite films, and some rationally designed surfactants will passivate the charge traps in bladed perovskite films. The bladed device efficiencies reach 20.3% for 0.075 cm$^2$ cell and above 15% for module with an aperture area over 30 cm$^2$. Based on this fast and high-quality perovskite scalable coating technique, an increased capacity, e.g., of 236 MW with a wide, e.g., 1 m wide, roll-to-roll manufacturing line is possible.

Blade Coating Speed and Film Deposition Mode

The blade coating of perovskite film is illustrated in FIG. 3, panel (a). A blade swipes perovskite precursor solution (ink) over a pre-heated substrate (typically 70° C.~145° C.). As solvent evaporates, perovskite precursor material crystallizes into black solid perovskite films. The pre-heating of the substrates can speed up blade coating and suppress the formation of needle-like structures in the perovskite films, because a fast evaporation of solvent may convert the ink directly into perovskites by skipping the needle-like intermediate phase.[16,21,25] Perovskite film thickness was measured as a function of coating speed after coating perovskite precursor solution of 1 M methylammonium lead halide (MAPbI$_3$) in dimethylformamide (DMF) on glass substrates preheated at 145° C. As is shown in FIG. 3, panel (b), the dependence of film thickness (t) on the speed of swiping/coating (v) would fall into two modes, which resembles that in dip-coating process.[26] When the blading speed is below 4 mm/s, the exponent is −0.99 that indicates blade coating is in evaporation mode where the ink dries right after blade moves away from the ink surface, and thus evaporation of the ink meniscus between blade and substrate governs the solute deposition.[19,26] He et al. has recently demonstrated that high quality perovskite films can be formed in this blading mode using high boiling solvent, yielding a device efficiency close to 20%, however the very slow coating rate of 0.012 millimeter per second (mm/s) limits its practical application. When the blading speed is above 20 mm/s, the exponent is 0.64, being very close to 0.66 predicted by Landau-Levich mode theory.[26] In "Landau-Levich" mode, the blading speed is much faster so that the as-coated thin ink layer is still wet right after blading. In some examples, the chosen blading speed was 50 mm/s or faster which falls in the Landau-Levich region, aiming at real application. It was observed that the ink was still wet after moving away the blade at such a high speed. Due to the high surface tension and non-volatile property of most known perovskite solvents (Table 1), the drying of a thin ink layer over a large area substrate poses a challenge for depositing compact and uniform perovskite films with a thickness of 500-600 nm needed for high efficiency perovskite solar cells.[4] Big "islands" with size of 10-200 micrometers assembled from many polycrystalline grains are obtained in the bladed perovskite films.[16] There are often large gap between one "island" to the other that causes large leakage current or even failure of blade-coated perovskite solar cells. One typical example of a gap is shown in FIG. 4. It is noted that the same surface feature is also observed on the film fabricated by other solution-based scalable coating methods, such as slot-die coating.[13,21]

TABLE 1

Surface tension, boiling point and vapor pressure of typical perovskite solvents

| Solvent | Surface tertsion at 20° C. (mN/m) | Boiling point (° C.) | Vapor pressure at 20° C. (Pa) |
|---|---|---|---|
| Dimethylformamide (DMF) | 37.1 | 152-154 | 360 |
| Dimethyl sulfoxide (DMSO) | 43.5 | 189 | 56 |
| γ-Butyrolactone (GBL) | 44.6 | 206 | 200 |
| N-Methyl-2-pyrrolidone (NMP) | 41.3 | 202-204 | 32 |

Observation and Suppression of Solution Flow by Surfactants

Since the "island" structures only appear in films formed by scalable coating processes, it should be related to the different fluid flowing dynamics during drying of the perovskite solution. To find out how these islands and wide gaps form and thus to find a solution to avoid them, a microscopy optical system was set up to observe the in-situ drying process of the perovskite solution right after blading. The optical system includes a fast optical microscope camera with a frame rate of 54 frame-per-second (fps). To slow down the drying process, N-Methyl-2-pyrrolidone (NMP) was used as the solvent for $CH_3NH_3PbI_3$ which has a lower vapor pressure than other common perovskite solvents. A coating temperature of 100° C. was chosen to avoid fast ink drying considering that the boiling point of NMP is 202° C. As shown in FIG. 4, panel (a), and video #1 (accessible at https://static-content.springer.com/esm/art%3A10.1038%2Fs41560-018-0153-9/MediaObjects/41560_2018_153_MOESM3_ESM.mp4), during drying of 1 M $MAPbI_3$/NMP solution right after blading, particles with diameter of 1~3 μm appeared in the solution at the early stage. These solid-state particles were identified to be the crystallized $MAPbI_3$.NMP intermediate phase by polarized optical microscopy and X-ray diffraction analysis (FIG. 8). These $MAPbI_3$.NMP particles in the perovskite solution served as the tracer to show the solution flow direction. It was found that these particles kept nearly stationary within the first second after blading, and then started to move when a perovskite island directly crystallized from the ink (which bypasses the intermediate phase stage, as discussed in the Additional Example below) at approx. 1.00 s after blading. The moving directions for four of the particles at different locations are highlighted in FIG. 4, panel (a), showing that they all moved towards the perovskite island. By stacking 30 of the video frames from 1.00 s to 2.00 s into one image (FIG. 4, panel (b)), the track of each particle is clearly revealed. FIG. 4, panel (b), shows that these particles moved towards the perovskite island from all directions. The directional movement of particles continued till the formation of the perovskite island completed when the ink dried at 5.00 s after blading (FIG. 4, panel (a)).

This observation suggests that there are microscale fluid flows moving towards perovskite islands during the drying of the perovskite ink after blading, which is illustrated in FIG. 4, panel (e), by both plane view and cross-section view. The transport of perovskite solute by the flows toward the center of the islands left partially-filled or empty gaps between the islands. Almost same ink drying processes and final morphologies were observed when we used other solvents such as (Dimethyl sulfoxide) DMSO or DMF at the blading temperatures of 100-145° C. (FIG. 9). Therefore, the solution flow dynamics should be general for perovskite inks at a wide blading temperature range, though in many cases intermediate phase particles might not be observed due to the quick conversion of solution to perovskite crystals.

The microscale fluid flows observed should have a driving force which is speculated to be induced by evaporation of solvent at the periphery of the perovskite islands. To suppress the flows for more uniform perovskite films, surfactants were added into the perovskite solution. As is well known, surfactant molecules contain both hydrophilic and hydrophobic functional groups. They can self-assemble on the surface of solution with hydrophobic group pointing to air to reduce the surface tension of the solution, as illustrated in FIG. 4, panel (f). The surface tension reduction was evidenced by the reduced contact angle of perovskite solution droplets on non-wetting substrate upon addition of surfactants (FIG. 10). When the directional flows transport surfactants to the periphery of perovskite islands, a surfactant concentration gradient is established with increasing concentration from solution to the island periphery, resulting in a decreasing surface tension gradient in the same direction (FIG. 4, panel (f)). Consequently, a "Marangoni flow"[27] driven by surfactant-induced surface tension gradient is formed, flowing from island periphery to solution. The Marangoni flow counteracts with the original flow, resulting in a completely suppressed fluid flow in the drying perovskite solution (FIG. 4, panel (f)).

Several types of surfactant were tested, including L-α-Phosphatidylcholine (LP), polyethylene glycol sorbitan monostearate (Tween 60), sodium dodecyl sulfate (SDS), and didodecyldimethylammonium bromide (DDAB), which are amphoteric, non-ionic, anionic, and cationic surfactant respectively, for assisting perovskite blade coating. Their molecular structures are shown in FIG. 11. From top-view scanning electron microscopy (SEM) it was found that all of them can suppress the "island" structure, though the degree of effectiveness varied (FIG. 5, panels (a-e)). Among these surfactants, L-α-Phosphatidylcholine (LP), which is an amphoteric surfactant, was chosen for optimization, because of its capability to passivate charge traps in hybrid perovskites with the charged quarterammonium ions.[28] When only ~20 ppm of LP was added, the directional movements of intermediate-phase particles toward perovskite islands disappeared, as shown in FIG. 4, panel (c), and video #2 (accessible at https://static-content.springer.com/esm/art%3A10.1038%2Fs41560-018-0153-9/MediaObjects/41560_2018_153_MOESM4_ESM.mp4). Stacking the video frames from 1.00 s to 2.00 s reveals no tracks of the motion of the particles (FIG. 4, panel (d)). It should be noted that the in-situ microscopy study of FIG. 4, panel (f), is done with using NMP as solvent and a lower coating temperature of 100° C., while the SEM images of FIG. 5 are all from coating with 0.8 M $MAPbI_3$/DMF solution at 145° C., which was optimized for device fabrication. Compared to the control sample with many island boundaries and gaps (FIG. 5, panel (a)), the film with LP added has no such structure (FIG. 5, panel (b)). The control film had a thickness variation from 1.4 μm to 0 μm from the island center to the edge, which is a consequence of microflow that transports perovskite solute to the center, resulting in the depletion of solute at the edge, i.e. a gap (FIG. 5, panel (a)). In striking contrast, the film bladed with LP had a uniform thickness of ~0.65 μm (FIG. 5, panel (b)). The photographic image for the blade-coated films in FIG. 5, panel (f), clearly shows that the films with LP surfactant is much smoother than the control films. The surface roughness profiling of the film bladed with LP additive over a 1 cm length scale presented in FIG. 5, panel (h), gives a root-mean-square (RMS) roughness of 14.5 nm, which is one order of magnitude smaller than that of the control film (FIG. 5, panel (g)). For a completed device, any pin-holes in the perovskite layer would increase leakage current (dark current).[29] The compactness of the film with surfactant was evidenced by a very small leakage current density below 100 nA/cm$^2$ at −0.4 V bias for a 1 cm$^2$ perovskite solar cell (FIG. 12), which is comparable to spin-coated perovskite device with smaller area.[29]

Wetting Improvement to Hydrophobic Substrates by Surfactants

De-wetting of perovskite solution is another challenge that prevents the deposition of uniform perovskite films by blading, especially on hydrophobic poly(bis(4-phenyl) (2,4,6-trimethylphenyl) amine (PTAA) covered indium tin oxide (ITO) substrates which is needed for high efficiency devices.[30] The perovskite solution firstly spread over the substrate by the blade, but shrunk quickly during drying, leaving most area uncovered after drying (FIG. 6, panel (a), left). To better understand the process, the drying of a perovskite ink droplet (~0.5 μl, 0.125 M MAPbI$_3$/DMF) on a hydrophobic substrate under ambient condition (FIG. 6, panel (b)) was monitored. During the evaporation of solvent, the droplet volume decreased, and the contact line (the edge of the droplet) moved with the coverage (defined by the projected area of droplet on substrate during drying versus that at the beginning) reducing to 25% (FIG. 6, panel (d)). The non-wetting problem was solved when LP surfactant was blended into the perovskite solution (FIG. 6, panel (c)). The coverage of the droplet remained almost 100% during the whole drying period. The contact line was strongly "pinned" onto the substrate. The pinning effect is commonly observed with hydrophilic substrate, but not hydrophobic substrate.[31] Therefore, it indicates that surfactant effectively modified the ink/substrate interface and improved the affinity of perovskite ink to hydrophobic substrate, as is schematically illustrated in FIG. 6, panels (e) and (f).[32, 33] The bladed perovskite films with LP surfactant additive could easily achieve full coverage on the PTAA/ITO/glass substrate, as shown in FIG. 6, panel (a), right. The wetting improvement was also observed with other type of surfactants, as is shown in FIG. 13.

Blade Coated Perovskite Device Characterization

The performances of perovskite solar cells made by the surfactant assisted blade coating are presented in FIG. 7. The device structure is indium tin oxide (ITO)/PTAA/MAPbI$_3$/fullerene (C$_{60}$)/Bathocuproine (BCP)/Cu. A device with small area of 7.5 mm$^2$ has short circuit current density (J$_{sc}$) of 22.4 mA/cm$^2$, open circuit voltage (V$_{oc}$) of 1.12 V and fill factor (FF) of 81.0% under one sun simulated illumination, giving a power conversion efficiency (PCE) of 20.3% (FIG. 7, panel (a)). The integrated J$_{sc}$ of 22.6 mA/cm$^2$ from external quantum efficiency agrees with J$_{sc}$ from J-V scanning measurement (FIG. 14). Devices fabricated with Tween 60 and DDAB as surfactant additives showed lower efficiency around 18.0% (FIG. 15), but still higher than previous best results based on MAPbI$_3$ without surfactant,[17] which confirms that there are two functions of LP surfactant: improving film quality by its surfactant nature and passivating perovskite defects by its functional groups.[28]

The surfactant assisted blading method was also evaluated for fabricating large area photovoltaic modules because of its scalability. To achieve a high efficiency module, the entire large area film is required to be defect-free. One single pin-hole may cause the shunt of a sub-cell, which dramatically reduces the performance of the module. Therefore, a module that retains the high efficiency of small area cells is an excellent demonstration of high quality of the large area perovskite film. Photos of a perovskite solar module fabricated on a 6×15 cm$^2$ sized glass substrate are shown in FIG. 7, panels (e) and (f). Each sub-cell in the module has width of 0.65 cm, in which the non-working area for connecting sub-cells in series (classic p1-p2-p3 configuration) is 0.043 cm wide (FIG. 16). Therefore, the geometrical fill factor, the ration of active area to the aperture area, is 93.4% which is among the best for perovskite solar module.[34] The detailed module design of sub-cell dimension and number of sub-cells are included in Table 2. The photocurrents of modules with aperture area of 33.0 cm$^2$ and 57.2 cm$^2$ show minor hysteresis with different bias scanning directions under one sun simulated illumination (FIG. 7, panel (b)). To provide a better evaluation of as-fabricated modules with respect to regular perovskite single cells, the module PCE, FF, and sub-cell equivalent J$_{SC}$ and V$_{OC}$ based on I-V curves in FIG. 7, panel (b), are included in Table 2 as well. The stabilized photocurrents of the two modules at their respective maximum power output point are shown in FIG. 7, panel (c), giving stabilized PCEs of 15.3% and 14.6%, respectively. The PCE, FF, and sub-cell equivalent V$_{OC}$ and J$_{SC}$ statistics of 8 modules with aperture area of ~57.2 cm$^2$ fabricated from 4 batches are presented in FIG. 17, showing a good reproducibility of the method. It should be noted that perovskite films were coated outside of clean rooms and in air. The high module efficiency was confirmed by an external Solar Power Lab at Arizona State University and the results are shown in FIG. 18. One measured module with aperture area of 57.8 cm$^2$ had PCE of 14.9% from reverse scan and 14.7% from forward scan. FIG. 7, panel (d), summarized the device efficiencies of the bladed cell and modules with different aperture areas, which shows the bladed devices maintained relatively high efficiencies when the aperture area is increased by two orders of magnitude, confirming the excellent quality of the perovskite films over large area formed by this method. FIG. 7, panel (d), also includes the reported best efficiencies of perovskite modules with different aperture areas fabricated by different methods,[11, 14, 18, 34] which shows that the present modules have the highest efficiencies. Considering a coating speed of 50 mm/s (180 m/h), and a PCE of 15.0% for the module, the surfactant additive assisted scalable coating should in principle allow an annual production capacity of 236 MW with a 1 m wide roll-to-roll manufacturing line. A stability study of the as-fabricated module shows no degradation of the PCE after over 20 days of storage in inert atmosphere (FIG. 19).

TABLE 2

Design and performance of modules with 33.0 and 57.2 cm$^2$ aperture area . . .

| Aperture area (cm$^2$) | Sub-cell size (cm$^2$) | Number of sub-cells | Sub-cell J$_{SC}$ (mA) | Average V$_{OC}$ (V) | FF (%) | PCE (%) | |
|---|---|---|---|---|---|---|---|
| 33.0 | 0.65 × 3.0 | 17 | 19.5 | 1.07 | 72.1 | 15.0 | Reverse |
| | | | 19.0 | 1.06 | 70.5 | 14.2 | Forward |
| 57.2 | 0.65 × 5.5 | 16 | 20.3 | 1.07 | 68.9 | 15.0 | Reverse |
| | | | 20.2 | 1.06 | 66.1 | 14.2 | Forward |

Conclusion

As demonstrated, surfactant additives of ~20 ppm in perovskite ink can significantly improve the blade coating quality of perovskite films at a high coating speed, e.g., 180 m/h. Perovskite solar cells and large area modules with high efficiencies were demonstrated. The mechanism studies revealed that surfactant effectively suppresses the solution flow dynamics in the drying ink layer and yields full-coverage coating by improving the adhesion of perovskite ink to hydrophobic substrates. Some surfactants could further improve device performance because of their passivation effect. Therefore, the surfactants could be a type of general additives in perovskite inks for improving perovskite film quality in various scalable fabrication methods.

Additional exemplary experimental details are described below.

Materials. All the materials were from Sigma Aldrich unless otherwise specified. Methylammonium iodide (MAI) was synthesized according to a previous method.[16] The CAS numbers and product codes for all surfactants used are listed below:

L-α-Phosphatidylcholine: CAS: 8002-43-5, Product code: P3556

Didodecyldimethylammonium bromide: CAS: 3282-73-3, Product code: 359025

Polyethylene glycol sorbitan monostearate (TWEEN 60): CAS: 9005-67-8, Product code: P1629

Sodium dodecyl sulfate: CAS: 151-21-3, Product code: 436143

Device fabrication. ITO/glass substrates were patterned by etching with HCl and Zinc powder and washed with detergent, deionized water, isopropanol and acetone sequentially and dried in an oven at 60° C. overnight. Firstly, 5 mg/ml of PTAA/toluene solution was blade coated on UV-ozone treated ITO/glass substrate at 20 mm/s. The gap between blade coater and substrate was 100 μm and the solution amount was 2.5 μl/cm (2.5 μl for every 1 cm width of substrate). Then the PTAA layer was annealed at 100° C. for 10 min. Perovskite layer blade coating was adjusted from the previous method.[16, 17] Here, surfactants were added into the perovskite precursor solution before use. For coating the best performing devices with LP surfactant, the concentration of MAPbI$_3$/DMF was 0.8 M (496 mg/ml) and that of LP/DMF was 0.25 mM (0.2 mg/ml). The other surfactants used for mechanism study were in the same molar concentration. Then 5-7 μl/cm of the precursor solution was swiped linearly by a film applicator with a gap between blade coater and substrate of 50-100 μm. The coating temperature was 145° C. and coating speed was 50 mm/s for best performing devices. After coating, the perovskite film was annealed for 10 min at 100° C. The PTAA and perovskite layers blade coatings were done in air. Then 30 nm of fullerene (C$_{60}$), 6 nm of Bathocuproine (BCP) and 100 nm of copper were thermally evaporated sequentially to complete the devices.

To fabricate specific perovskite solar modules, the ITO electrode, a PTAA/perovskite/C$_{60}$/BCP stacking layer, and a Cu electrode were ablated by an excimer laser scriber (Resonetics Rapid X250) sequentially to form p1-p2-p3 pattern as shown in FIG. 16. The design of laser scribing experiment is referred to recent publications.[35, 36] The widths are 50 μm, 100 μm, 150 μm for ITO, PTAA/perovskite/C$_{60}$/BCP, Cu electrode, respectively which is limited by our current laser scribing system.

Device characterization. The J-V measurement of devices were performed with a Keithley 2400 Source-Meter under simulated AM 1.5G irradiation produced by a Xenon-lamp-based solar simulator (Oriel Sol3A, Class AAA Solar Simulator). The light intensity was calibrated by a silicon reference cell (Newport 91150V-KG5). The scan rate was 0.2 V/s for small area device and 1 V/s for modules. The delay time was 10 ms. There was no preconditioning before measurement. The steady-state PCE was measured by applying the bias voltage at maximum power output point obtained by I-V scanning and recording the photocurrent. The external quantum efficiency (EQE) spectra were obtained by a Newport QE measurement kit by focusing a monochromatic light beam with wavelength from 300 nm to 900 nm onto the devices. More information on the solar cell testing can be found at solar cell reporting summary section in the Additional Example, below. The scanning electron microscopy (SEM) images were taken by a Quanta 200 FEG environmental scanning electron microscope. The XRD pattern was obtained with a Bruker-AXS D8 Discover Diffractometer. The surface roughness profiling of blade coated perovskite films was measured with a Dektak XT profiler.

REFERENCES CORRESPONDING TO EXAMPLES

1. Yablonovitch, E. Lead halides join the top optoelectronic league. *Science*, 351, 1401-1401 (2016).
2. Yang, Y., You, J. Make perovskite solar cells stable. *Nature*, 544, 155-156 (2017).
3. Li, X., Bi, D., Yi, C., Décoppet, J.-D., Luo, J., Zakeeruddin, S. M., Hagfeldt, A., Grätzel, M. A vacuum flash-assisted solution process for high-efficiency large-area perovskite solar cells. *Science*, 353, 58-62 (2016).
4. Tan, H., Jain, A., Voznyy, O., Lan, X., de Arquer, F. P. G., Fan, J. Z., Quintero-Bermudez, R., Yuan, M., Zhang, B., Zhao, Y. Efficient and stable solution-processed planar perovskite solar cells via contact passivation. *Science*, 355, 722-726 (2017).
5. Yang, W. S., Park, B.-W., Jung, E. H., Jeon, N. J., Kim, Y. C., Lee, D. U., Shin, S. S., Seo, J., Kim, E. K., Noh, J. H. Iodide management in formamidinium-lead-halide-based perovskite layers for efficient solar cells. *Science*, 356, 1376-1379 (2017).
6. Son, D.-Y, Lee, J.-W., Choi, Y. J., Jang, I.-H., Lee, S., Yoo, P. J., Shin, H., Ahn, N., Choi, M., Kim, D. Self-formed grain boundary healing layer for highly efficient CH3 NH3 PbI3 perovskite solar cells. *Nature Energy*, 1, 16081 (2016).
7. Zhao, D., Yu, Y., Wang, C., Liao, W., Shrestha, N., Grice, C. R., Cimaroli, A. J., Guan, L., Ellingson, R. J., Zhu, K., Zhao, X., Xiong, R.-G., Yan, Y. Low-bandgap mixed tin-lead iodide perovskite absorbers with long carrier lifetimes for all-perovskite tandem solar cells. *Nature Energy*, 2, 17018 (2017).
8. Eperon, G. E., Leijtens, T., Bush, K. A., Prasanna, R., Green, T., Wang, J. T.-W., McMeekin, D. P., Volonakis, G., Milot, R. L., May, R. Perovskite-perovskite tandem photovoltaics with optimized band gaps. *Science*, 354, 861-865 (2016).
9. Barrows, A. T., Pearson, A. J., Kwak, C. K., Dunbar, A. D. F., Buckley, A. R., Lidzey, D. G. Efficient planar heterojunction mixed-halide perovskite solar cells deposited via spray-deposition. *Energy & Environmental Science*, 7, 2944-2950 (2014).
10. Bag, S., Deneault, J. R., Durstock, M. F. Aerosol☐Jet☐Assisted Thin☐Film Growth of CH3NH3PbI3 Perovskites—A Means to Achieve High Quality, Defect☐Free Films for Efficient Solar Cells. *Advanced Energy Materials*, 7, 1701151 (2017).

11. Kim, J., Yun, J. S., Cho, Y., Lee, D. S., Wilkinson, B., Soufiani, A. M., Deng, X., Zheng, J., Shi, A., Lim, S. Overcoming the Challenges of Large-Area High-Efficiency Perovskite Solar Cells. *ACS Energy Letters*, 2, 1978-1984 (2017).
12. Chen, H., Wei, Z., Zheng, X., Yang, S. A scalable electrodeposition route to the low-cost, versatile and controllable fabrication of perovskite solar cells. *Nano Energy*, 15, 216-226 (2015).
13. Ye, F., Chen, H., Xie, F., Tang, W., Yin, M., He, J., Bi, E., Wang, Y., Yang, X., Han, L. Soft-cover deposition of scaling-up uniform perovskite thin films for high cost-performance solar cells. *Energy & Environmental Science*, 9, 2295-2301 (2016).
14. Chen, H., Ye, F., Tang, W., He, J., Yin, M., Wang, Y., Xie, F., Bi, E., Yang, X., Grätzel, M. A solvent- and vacuum-free route to large-area perovskite films for efficient solar modules. *Nature*, 550, 92-95 (2017).
15. Kim, J. H., Williams, S. T., Cho, N., Chueh, C.-C., Jen, A. K. Y. Enhanced Environmental Stability of Planar Heterojunction Perovskite Solar Cells Based on Blade-Coating. *Advanced Energy Materials*, 5, 1401229-n/a (2015).
16. Deng, Y., Peng, E., Shao, Y., Xiao, Z., Dong, Q., Huang, J. Scalable fabrication of efficient organolead trihalide perovskite solar cells with doctor-bladed active layers. *Energy & Environmental Science*, 8, 1544-1550 (2015).
17. Deng, Y., Dong, Q., Bi, C., Yuan, Y., Huang, J. Air☐Stable, Efficient Mixed☐Cation Perovskite Solar Cells with Cu Electrode by Scalable Fabrication of Active Layer. *Advanced Energy Materials*, 6, 1600372 (2016).
18. Yang, M., Li, Z., Reese, M. O., Reid, O. G., Kim, D. H., Siol, S., Klein, T. R., Yan, Y., Berry, J. J., van Hest, M. F. Perovskite ink with wide processing window for scalable high-efficiency solar cells. *Nature Energy*, 2, 17038 (2017).
19. He, M., Li, B., Cui, X., Jiang, B., He, Y., Chen, Y., O'Neil, D., Szymanski, P., EI-Sayed, M. A., Huang, J. Meniscus-assisted solution printing of large-grained perovskite films for high-efficiency solar cells. *Nature Communications*, 8, 16045 (2017).
20. Hwang, K., Jung, Y.-S., Heo, Y.-J., Scholes, F. H., Watkins, S. E., Subbiah, J., Jones, D. J., Kim, D.-Y, Vak, D. Toward Large Scale Roll-to-Roll Production of Fully Printed Perovskite Solar Cells. *Advanced Materials*, 27, 1241-1247 (2015).
21. Hu, Q., Zhao, L., Wu, J., Gao, K., Luo, D., Jiang, Y., Zhang, Z., Zhu, C., Zhu, E., Hexemer, A. In-Situ Dynamic Observations of Perovskite Crystallization and Microstructure Evolution Intermediated from [PbI6] 4-Cage Nanoparticles. *Nature Communications*, 8, 15688 (2017).
22. Di Giacomo, F., Shanmugam, S., Fledderus, H., Bruijnaers, B. J., Verhees, W. J., Dorenkamper, M. S., Veenstra, S. C., Qiu, W., Gehlhaar, R., Merckx, T. Up-scalable sheet-to-sheet production of high efficiency perovskite module and solar cells on 6-in. substrate using slot die coating. *Solar Energy Materials and Solar Cells* (2017).
23. Tang, S., Deng, Y., Zheng, X., Bai, Y., Fang, Y., Dong, Q., Wei, H., Huang, J. Composition Engineering in Doctor 0 Blading of Perovskite Solar Cells. *Advanced Energy Materials*, 7, 1700302 (2017).
24. Ye, F., Tang, W., Xie, F., Yin, M., He, J., Wang, Y., Chen, H., Qiang, Y., Yang, X., Han, L. Low☐Temperature Soft☐Cover Deposition of Uniform Large☐Scale Perovskite Films for High☐Performance Solar Cells. *Advanced Materials*, 29, 1701440 (2017).
25. Li, Y., Zhao, Z., Lin, F., Cao, X., Cui, X., Wei, J. In Situ Observation of Crystallization of Methylammonium Lead Iodide Perovskite from Microdroplets. *small*, 13, (2017).
26. Le Berre, M., Chen, Y., Baigl, D. From convective assembly to Landau-Levich deposition of multilayered phospholipid films of controlled thickness. *Langmuir*, 25, 2554-2557 (2009).
27. Kim, H., Boulogne, F., Um, E., Jacobi, I., Button, E., Stone, H. A. Controlled uniform coating from the interplay of Marangoni flows and surface-adsorbed macromolecules. *Physical review letters*, 116, 124501 (2016).
28. Zheng, X., Chen, B., Dai, J., Fang, Y., Bai, Y., Lin, Y., Wei, H., Zeng, X. C., Huang, J. Defect passivation in hybrid perovskite solar cells using quaternary ammonium halide anions and cations. *Nature Energy*, 2, 17102 (2017).
29. Fang, Y., Huang, J. Resolving weak light of sub☐picowatt per square centimeter by hybrid perovskite photodetectors enabled by noise reduction. *Advanced Materials*, 27, 2804-2810 (2015).
30. Bi, C., Wang, Q., Shao, Y., Yuan, Y., Xiao, Z., Huang, J. Non-wetting surface-driven high-aspect-ratio crystalline grain growth for efficient hybrid perovskite solar cells. *Nature communications*, 6, 7747 (2015).
31. McLauchlin, M. L., Yang, D., Aella, P., Garcia, A. A., Picraux, S., Hayes, M. A. Evaporative properties and pinning strength of laser-ablated, hydrophilic sites on lotus-leaf-like, nanostructured surfaces. *Langmuir*, 23, 4871-4877 (2007).
32. Milne, A. J., Amirfazli, A. Autophilic effect: wetting of hydrophobic surfaces by surfactant solutions. *Langmuir*, 26, 4668-4674 (2009).
33. Stoebe, T., Lin, Z., Hill, R. M., Ward, M. D., Davis, H. T. Surfactant-enhanced spreading. *Langmuir*, 12, 337-344 (1996).
34. Rakocevic, L., Gehlhaar, R., Merckx, T., Qiu, W., Paetzold, U. W., Fledderus, H., Poortmans, J. Interconnection Optimization for Highly Efficient Perovskite Modules. *IEEE Journal of Photovoltaics*, 7, 404-408 (2017).
35. Palma, A. L., Matteocci, F., Agresti, A., Pescetelli, S., Calabrò, E., Vesce, L., Christiansen, S., Schmidt, M., Di Carlo, A. Laser-patterning engineering for perovskite solar modules with 95% aperture ratio. *IEEE Journal of Photovoltaics*, 7, 1674-1680 (2017).
36. Moon, S.-J., Yum, J.-H., Lofgren, L., Walter, A., Sansonnens, L., Benkhaira, M., Nicolay, S., Bailat, J., Ballif, C. Laser-scribing patterning for the production of orgonometallic halide perovskite solar modules. *IEEE Journal of Photovoltaics*, 5, 1087-1092 (2015).

Additional Example: Supplementary Information.

In reference to Table 2, the $J_{SC}$ and $V_{OC}$ values are calculated based on individual sub-cell to provide a better evaluation of their performance with respect to that of regular single cell.

It can be seen that many particles evolved from the solution, as is the case in FIG. 8, panel (h), discussed above. They appeared bright under polarized imaging (FIG. 8, panel (b)), indicating these particles are crystallized. They don't absorb visible light, so they are not $MAPbI_3$ crystals. They should be the crystallized intermediate phase of $MAPbI_3.NMP$. Upon further drying, these bright particles disappear (FIG. 8, panel (e)) as they have converted to perovskite. The particulate morphology of intermediate phase is inherited in the final perovskite film (FIG. 8, panel (f)). Although there is no study on $MAPbI_3.NMP$ intermediate phase, perovskite materials are known to form intermediate phases with other solvents including DMSO and DMF. The same experiment with MAPbI$_3$/DMF solution was performed and bright crystals were observed under polarized microscopy as well, though these crystals are microfibers instead of particles (FIG. 8, panel (g)). These microfibers were collected and measured by X-ray diffraction (XRD) (FIG. 8, panel (h)). The XRD pattern agree well with the calculated MAPbI$_3$.DMF intermediate phase (e.g., see: Nenon D P, Christians J A, Wheeler L M, et al. Structural and chemical evolution of methylammonium lead halide perovskites during thermal processing from solution [J]. Energy & Environmental Science, 2016, 9(6): 2072-2082.).

During drying, direct crystallization of MAPbI$_3$ from MAPbI$_3$/NMP solution was also observed (FIG. 8, panel (c)) without transitioning the MAPbI3.NMP intermediate phases. The directly crystallized perovskite grows radially and forms the "island" structure (FIG. 8, panels (d-f)).

Statements Regarding Incorporation by Reference and Variations

U.S. Pat. No. 9,583,724 discloses additional features, including blade coating processes perovskite solution materials and other device layer materials, and is hereby incorporated by reference in its entirety.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosed subject matter (especially in the context of the following claims) are to be construed to cover both the singular and the plural, unless otherwise indicated herein or clearly contradicted by context. The use of the term "at least one" followed by a list of one or more items (for example, "at least one of A, B and C") is to be construed to mean one item selected from the listed items (A or B or C) or any combination of two or more of the listed items (A and B, or A and C, or B and C, or A and B and C), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein (e.g., recitation of a value "selected from the range of X to Y," in which X and Y are inclusive boundary values of the range). All methods described herein can be performed in any suitable order unless otherwise indicated herein or otherwise clearly contradicted by context. The use of any and all examples, or example language (e.g., "such as") provided herein, is intended merely to better illuminate the disclosed subject matter and does not pose a limitation on the scope of the invention unless otherwise claimed. No language in the specification should be construed as indicating any non-claimed element as essential to the practice of the invention.

Every device, system, composition, formulation, combination of components, or method described or exemplified herein can be used to practice the invention, unless otherwise stated.

When a group of substituents is disclosed herein, it is understood that all individual members of that group and all subgroups, including variations of a coating method (e.g., slot die coating, extrusion coating, curtain coating, slide coating, slot die coating, slot die bead coating, and tensioned-web slotdie coating), and including any isomers, enantiomers, and diastereomers of the group members are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

One of ordinary skill in the art will appreciate that starting materials, reagents, synthetic methods, purification methods, analytical methods, photoactive device configurations (e.g., electrode configurations of photovoltaic cell), and photovoltaic cell measurements, other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

Certain embodiments are described herein. Variations of those embodiments may become apparent to those of ordinary skill in the art upon reading the foregoing description. The inventors expect skilled artisans to employ such variations as appropriate, and the inventors intend for the embodiments to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

We claim:

1. A method of forming a photoactive device, the method comprising steps of:
   providing a perovskite-surfactant solution,
   said perovskite-surfactant solution comprising a perovskite ink and a zwitterionic surfactant; wherein the perovskite ink comprises at least one solvent; and wherein a concentration of said surfactant in said perovskite-surfactant solution is selected from the range of 0.01 to 1 mM; and
   coating said perovskite-surfactant solution onto a receiving surface of a substrate in a coating step thereby forming a layer of said photoactive device;
   wherein said layer comprises a perovskite material;
   wherein the perovskite material crystallizes during the coating step;
   wherein during the step of coating the surfactant forms a first self-assembled layer at a first interface, the first interface being an interface of the substrate and the perovskite-surfactant solution, with hydrophobic groups of the surfactant aligned to the receiving surface of the substrate and hydrophilic groups of the surfactant aligned to the perovskite-surfactant solution at the first interface;
   wherein during the step of coating the surfactant further forms a second self-assembled layer at a second interface, the second interface being an interface of the perovskite-surfactant solution and air, with hydrophobic groups of the surfactant pointing to the air and hydrophilic groups of the surfactant aligned to the perovskite-surfactant solution at the second interface;
   wherein the step of coating is performed using a blade coating process; and wherein an active area of said photoactive device is at least 1 cm$^2$.

2. The method of claim 1, wherein said coating is performed at a coating speed of at least 20 mm/s.

3. The method of claim 1, wherein said substrate is heated to a temperature of at least 100° C. during said step of coating.

4. The method of claim 1, further comprising combining said surfactant and said perovskite ink to form said perovskite-surfactant solution.

5. The method of claim 1, wherein the perovskite material comprises at least one of methylammonium lead halide, formamidinium lead halide, cesium lead halide, methylammonium tin halide, formamidinium tin halide, and cesium tin halide.

6. The method of claim 1, wherein the at least one solvent comprises at least one of water, methanol, 1-propanol (PrOH), isopropyl alcohol, 1-Pentanol, hydrogen iodide aqueous solution, dimethylethanolamine, acetic acid, xylene, ethylene glycol, diethyl ether, acetonitrile, Sulfolane, Dimethylformamide (DMF), Diethylformamide, methyl phenyl sulfoxide, diphenyl sulfoxide, diethyl sulfite, methylsulfonylmethane, tetramethylene sulfane, ethylene sulfite, nitrous acid, nitromethane, thiosulfuric acid, dimethyl sulfate, hydrophosphorous acid, sulfuric acid, phosphoric acid, Formamide, Dimethylacetamide (DMAc), N-Methylformamide, N-Methyl-2-pyrrolidone (NMP), 1,3-Dimethyl-2-imidazolidinone, N-Vinylacetamide, N,N'-Dimethylpropyleneurea (DMPU), 2-dimethylaminoethanol, Ethyl lactate, N-Vinylpyrrolidone, Dimethyl sulfoxide (DMSO), diethyl sulfoxide, tetrahydrothiophene oxide, N-Formylmorpholine, N-Methylformamide, 2-Pyrrolidone, Tetramethylurea, N-Vinylacetamide, N-Vinylpyrrolidone, Dimethyl sulfite, Diethyl sulfite, Methyl methanesulfonate, Dimethyl sulfate, 1,3-Dimethyl-2-imidazolidinone, gamma-Butyrolactone (GBL), Dioxane, Dioxolane, Propylene carbonate (PC), 1,2-dimethoxyethane, methyl ethyl ketone, 2-methylpyrazine, 2-Methoxyethanol, 2-Methoxyethanol acetate, 2-Ethoxyethanol, 2-Ethoxyethanol acetate, 1-Methoxy-2-propanol, 1-methoxy-2-propanol acetate, 2-Butoxyethanol, 2-Butoxyethanol acetate, 2-Propyloxyethanol, 2-Propyloxyethanol acetate, Ethyl 3-ethoxypropionate, ethylene glycol monopropyl ether, amine, and methylamine.

7. The method of claim 1, wherein said active area is at least 15 cm$^2$.

8. The method of claim 1, wherein said photoactive device is a photovoltaic cell.

9. The method of claim 8, wherein said photovoltaic cell is characterized by a photovoltaic efficiency of at least 15%.

10. The method of claim 1, wherein the perovskite material is characterized by formula having a halide anion.

11. The method of claim 1, wherein the perovskite material crystallizes during evaporation of the solvent during the step of coating.

12. The method of claim 1, wherein the perovskite ink comprises a perovskite precursor that forms the perovskite material during coating of the perovskite-surfactant solution.

13. The method of claim 12, wherein the perovskite precursor crystallizes into the perovskite layer as the solvent evaporates.

14. The method of claim 1, wherein crystallized particles and/or crystallized islands of the perovskite material form in the coated perovskite-surfactant solution after the solution is coated onto the receiving surface of the substrate.

15. The method of claim 1, wherein the layer of the photoactive device comprises the surfactant and wherein the surfactant passivates charge traps in the perovskite material.

16. The method of claim 1, wherein the receiving surface comprises a hydrophobic surface.

17. The method of claim 1, wherein the surfactant self-assembles forming a hydrophobic layer on a surface of the perovskite material.

18. A method of forming a photoactive device, the method comprising steps of:
   providing a perovskite-surfactant solution,
   said perovskite-surfactant solution comprising a perovskite ink and a zwitterionic surfactant; wherein the perovskite ink comprises at least one solvent; wherein a concentration of said surfactant in said perovskite-surfactant solution is selected from the range of 0.01 to 1 mM; and
   coating said perovskite-surfactant solution onto a receiving surface of a substrate in a coating step thereby forming a layer of said photoactive device; wherein:
   said layer comprises a perovskite material;
   the perovskite material crystallizes during the coating step;
   during the step of coating the surfactant forms a first self-assembled layer at a first interface, the first interface being an interface of the substrate and the perovskite-surfactant solution, with hydrophobic groups of the surfactant aligned to the receiving surface of the substrate and hydrophilic groups of the surfactant aligned to the perovskite-surfactant solution at the first interface;

during the step of coating the surfactant further forms a second self-assembled layer at a second interface, the second interface being an interface of the perovskite-surfactant solution and air, with hydrophobic groups of the surfactant pointing to the air and hydrophilic groups of the surfactant aligned to the perovskite-surfactant solution at the second interface;

the step of coating is performed using a blade coating process; and said coating is performed at a coating speed of at least 10 mm/s.

19. The method of claim 18, wherein an active area of said photoactive device is at least 1 $cm^2$.

20. The method of claim 19, wherein said active area is at least 15 $cm^2$.

21. The method of claim 18, wherein said photoactive device is a photovoltaic cell.

22. The method of claim 21, wherein said photovoltaic cell is characterized by a photovoltaic efficiency of at least 15% and an active area of at least 1 cm2.

* * * * *